(12) United States Patent
Takahashi

(10) Patent No.: US 7,859,059 B2
(45) Date of Patent: Dec. 28, 2010

(54) SEMICONDUCTOR DEVICE AND METHOD FOR MANUFACTURING SAME

(75) Inventor: Kensuke Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 154 days.

(21) Appl. No.: 12/375,183

(22) PCT Filed: Jul. 23, 2007

(86) PCT No.: PCT/JP2007/064397

§ 371 (c)(1), (2), (4) Date: Jan. 26, 2009

(87) PCT Pub. No.: WO2008/013125

PCT Pub. Date: Jan. 31, 2008

(65) Prior Publication Data

US 2009/0250757 A1    Oct. 8, 2009

(30) Foreign Application Priority Data

Jul. 25, 2006    (JP) ............................. 2006-201855

(51) Int. Cl.
H01L 29/76    (2006.01)
H01L 29/94    (2006.01)
H01L 31/062    (2006.01)
H01L 31/119    (2006.01)

(52) U.S. Cl. ........................ 257/369; 257/407; 257/411; 257/E21.161; 257/E21.199; 257/E21.632; 257/E29.255

(58) Field of Classification Search ................. 257/369, 257/407, 411, E21.161, E21.199, E21.632, 257/E29.255
See application file for complete search history.

(56) References Cited

U.S. PATENT DOCUMENTS 6,992,357 B2    1/2006    Matsuo et al.

(Continued)

FOREIGN PATENT DOCUMENTS

JP    2003-258121    9/2003

(Continued)

OTHER PUBLICATIONS

D1: Electron Devices Meeting, 2004. IEDM Technical Digest. IEEE International vol. , Issue , Dec. 13-15, 2004, pp. 83-86.

(Continued)

*Primary Examiner*—David S Blum
(74) *Attorney, Agent, or Firm*—Young & Thompson

(57) ABSTRACT

There is provided a semiconductor device having excellent device characteristics and reliability in which $V_{th}$ values of an nMOS transistor and a pMOS transistor are controlled to be values necessary for a low-power device. The semiconductor device includes a pMOS transistor and an nMOS transistor formed by using an SOI substrate. The pMOS transistor is a fully depleted MOS transistor including a first gate electrode comprising at least one type of crystalline phase selected from the group consisting of a $WSi_2$ crystalline phase, an $MoSi_2$ crystalline phase, an NiSi crystalline phase, and an $NiSi_2$ crystalline phase as silicide region (1). The nMOS transistor is a fully depleted MOS transistor comprising at least one type of crystalline phase selected from the group consisting of a PtSi crystalline phase, a $Pt_2Si$ crystalline phase, an IrSi crystalline phase, an $Ni_2Si$ crystalline phase, and an $Ni_3Si$ crystalline phase as silicide region (2).

49 Claims, 27 Drawing Sheets

U.S. PATENT DOCUMENTS

| | | |
|---|---|---|
| 7,148,546 B2 | 12/2006 | Visokay et al. |
| 7,226,827 B2 | 6/2007 | Schram et al. |
| 7,592,674 B2 * | 9/2009 | Takahashi et al. ........... 257/369 |
| 2005/0051845 A1 | 3/2005 | Nakagawa et al. |
| 2006/0131676 A1 | 6/2006 | Saito et al. |
| 2007/0284671 A1 * | 12/2007 | Tsutsumi et al. ............ 257/369 |
| 2008/0261394 A1 * | 10/2008 | Wang et al. ................. 438/664 |

FOREIGN PATENT DOCUMENTS

| | | |
|---|---|---|
| JP | 2004-221226 | 8/2004 |
| JP | 2004-356472 | 12/2004 |
| JP | 2005-085949 | 3/2005 |
| JP | 2005-123625 | 5/2005 |
| JP | 2005-129551 | 5/2005 |
| JP | 2006-156807 | 6/2006 |
| WO | 2006-001272 | 5/2006 |

OTHER PUBLICATIONS

D2: Electron Devices Meeting, 2005. IEDM Technical Digest. IEEE International, pp. 911-914.

D3: Electron Devices Meeting, 2005. IEDM Technical Digest. IEEE International, pp. 649-652.

D4: Electron Devices Meeting, 2002. IEDM '02. Digest. International, pp. 247- 250.

D5: Electron Devices Meeting, 2005. IEDM Technical Digest. IEEE International, pp. 227-230.

D6: Electron Devices Meeting, 2003. IEDM apos;03 Technical Digest. IEEE International, pp. 315-318.

D7: Electron Devices Meeting, 2002. IEDM '02. Digest. International, pp. 359-362.

D8: Electron Devices Meeting, 1985 International, pp. 415-418.

D9: 36th IEEE Semiconductor Interface Specialists Conference, Dec. 1-3, 2005.

D10: Electron Devices Meeting, 2004. IEDM Technical Digest. IEEE International vol. , Issue , Dec. 13-15, 2004 pp. 91-94.

D11: 2005 Symposium onVLSI Technology Digest of Technical Papers, pp. 86-87.

D12: 2005 Symposium onVLSI Technology Digest of Technical Papers, pp. 68-69.

* cited by examiner

FIG.7
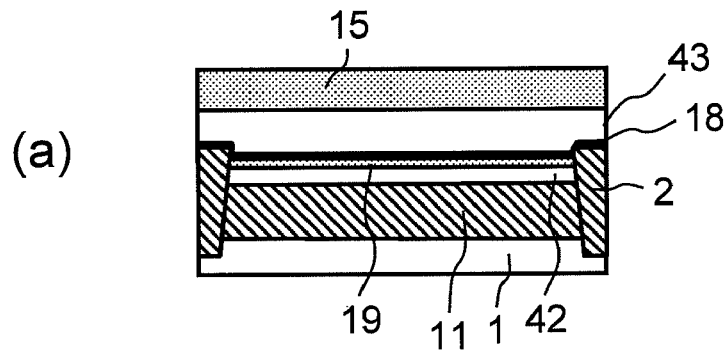
(a)
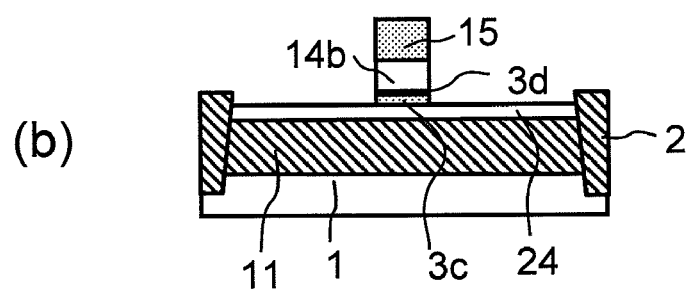
(b)
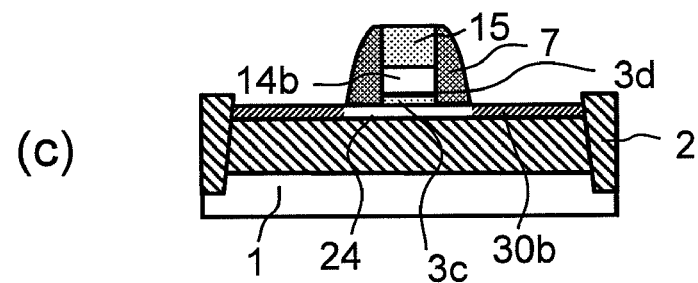
(c)
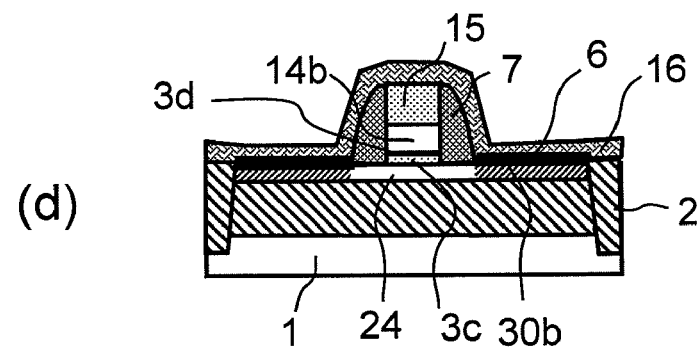
(d)

FIG.8
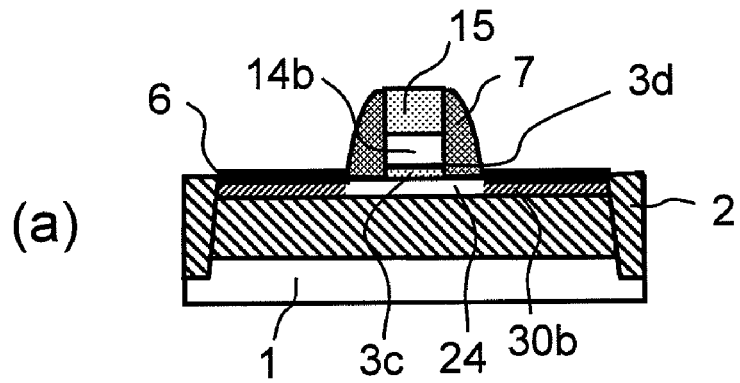
(a)
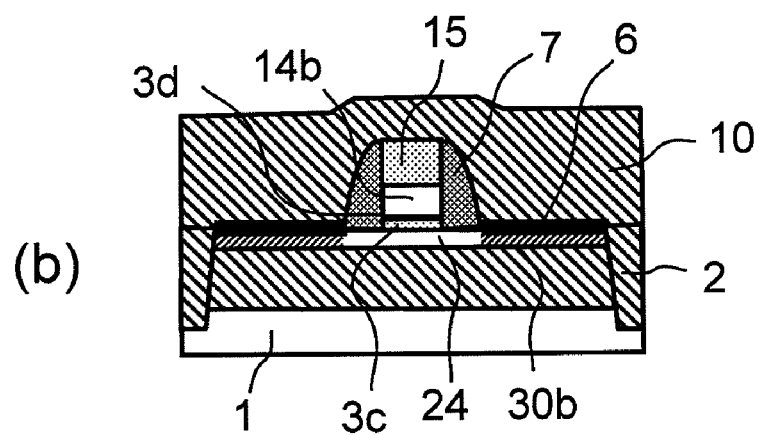
(b)
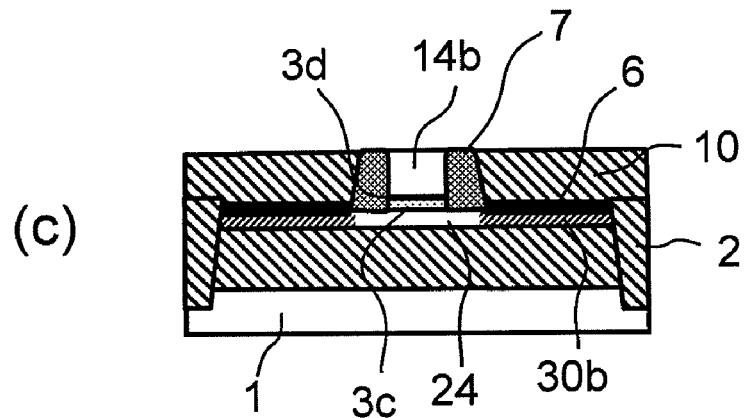
(c)

FIG.9
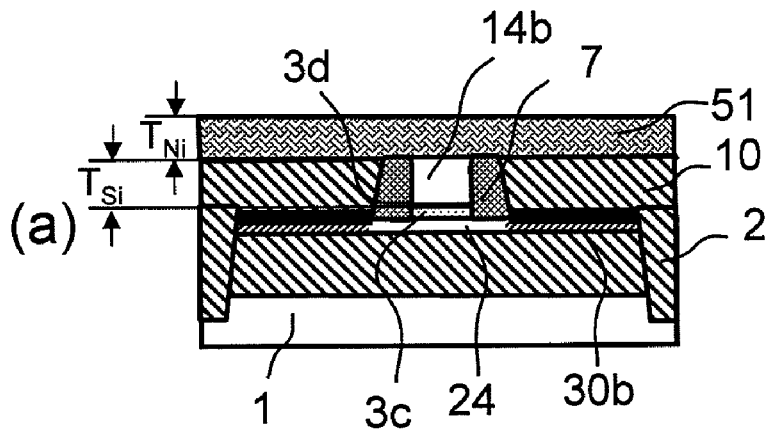
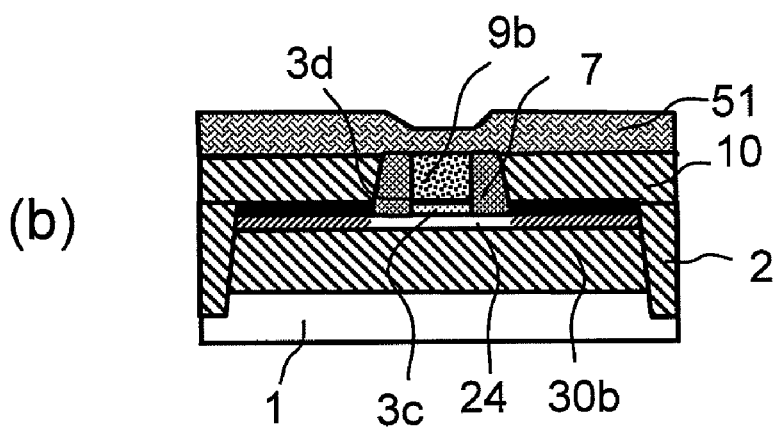
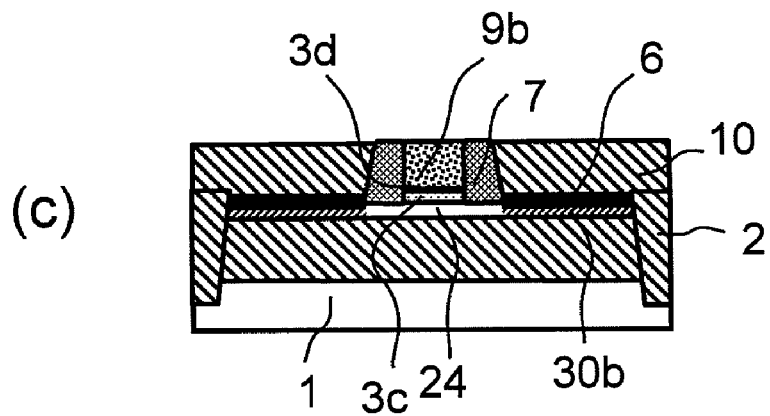

FIG.11
(a) 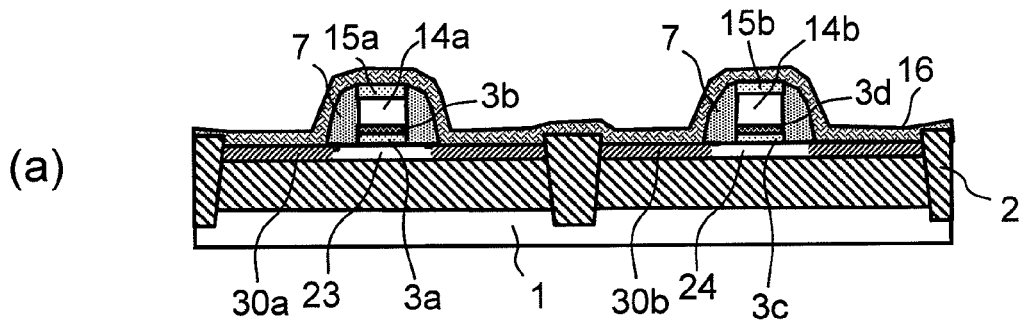
(b) 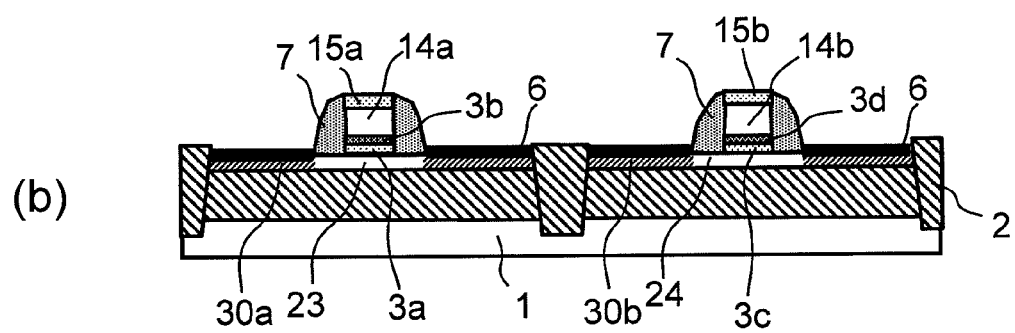
(c) 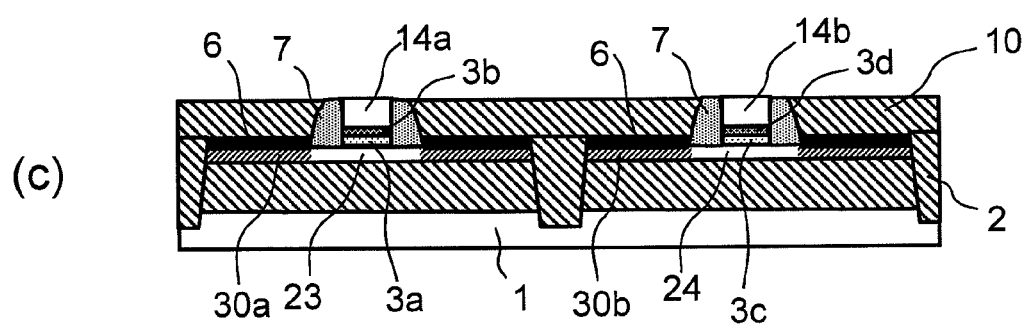

FIG.18
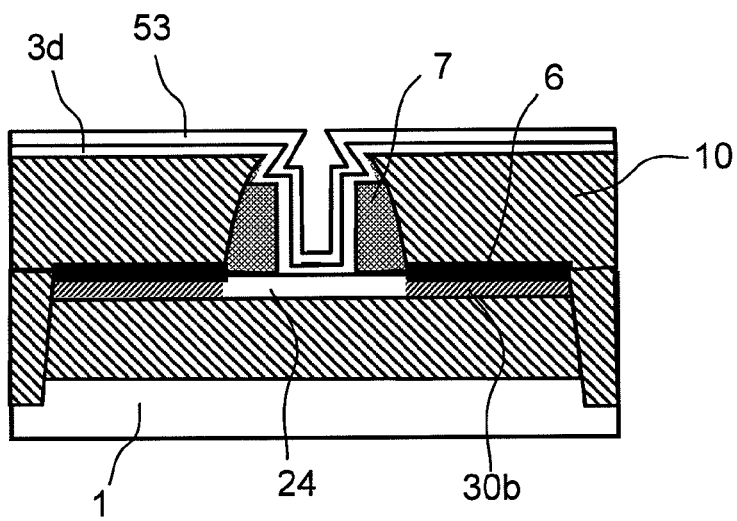
(a)
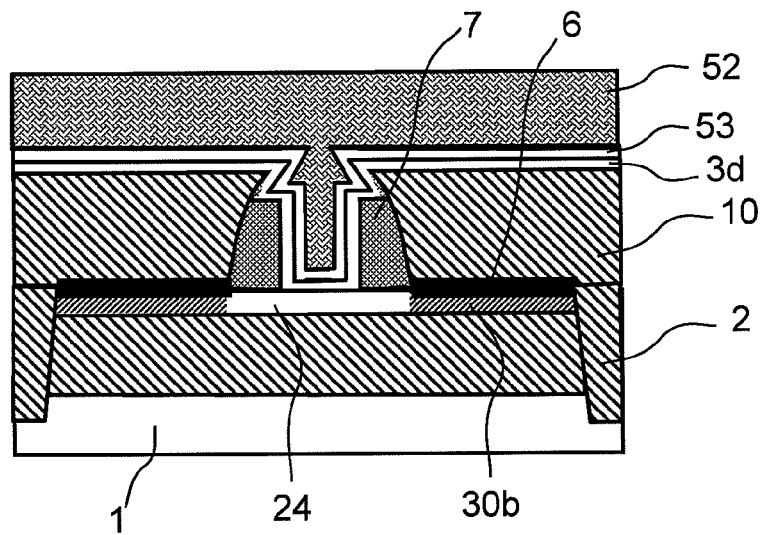
(b)
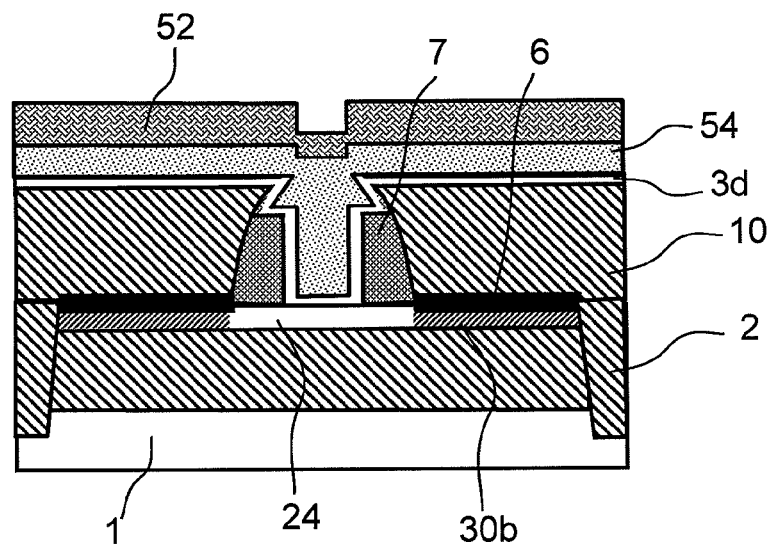
(c)

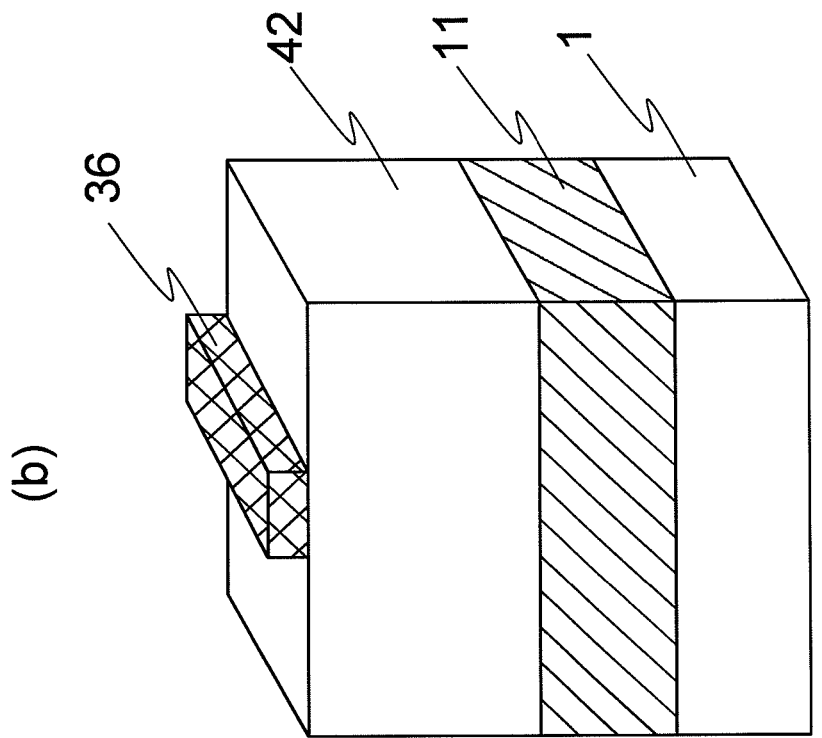
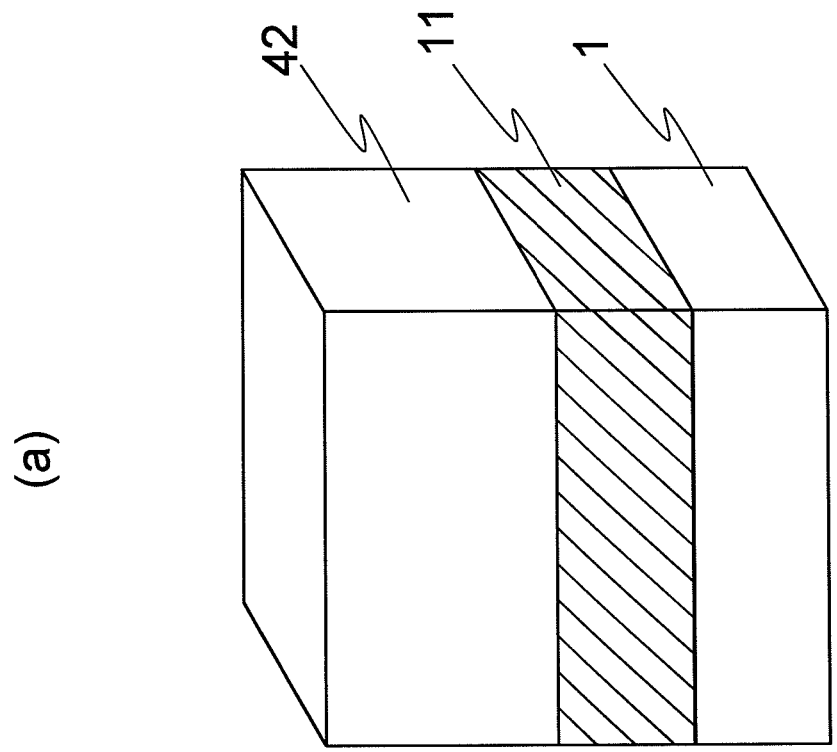
FIG.19

FIG.21
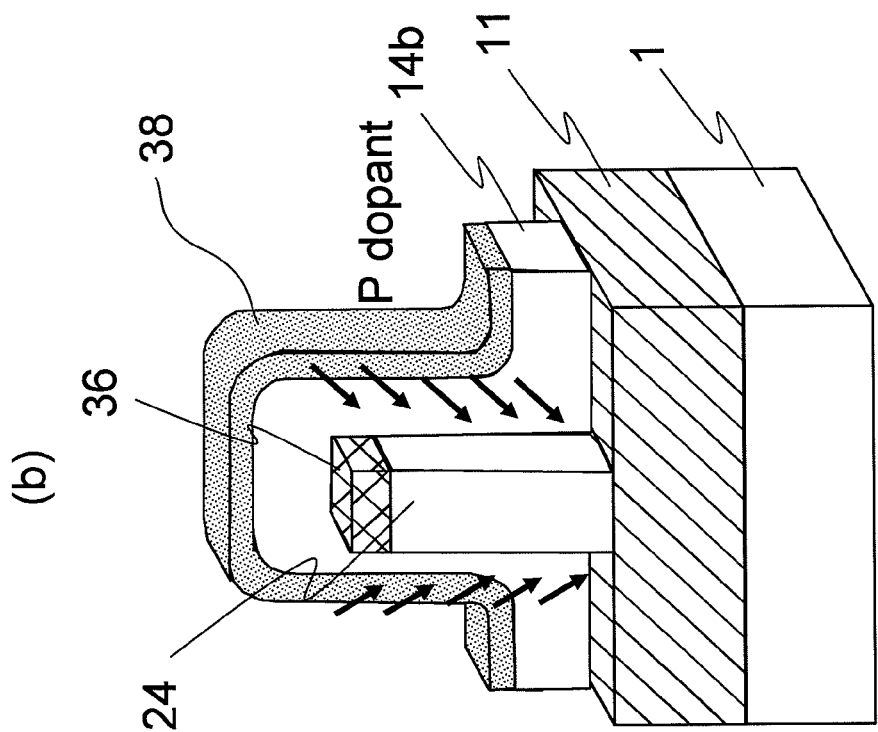
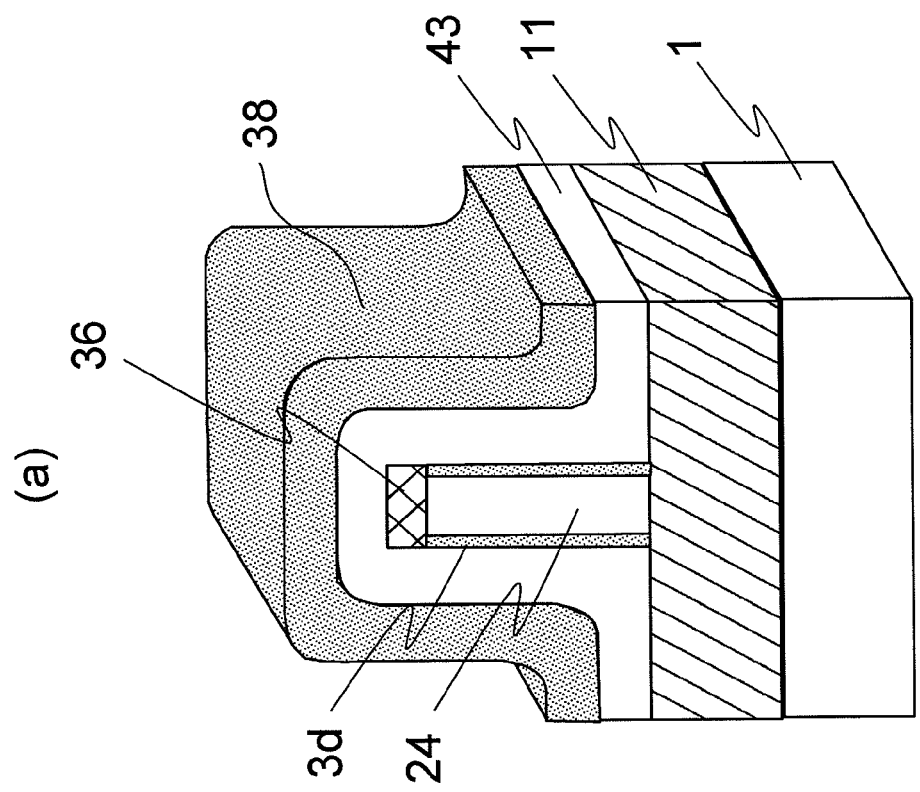

SEMICONDUCTOR DEVICE AND METHOD FOR MANUFACTURING SAME

TECHNICAL FIELD

The present invention relates to a fully depleted nMOS transistor and pMOS transistor fabricated by using an SOI substrate, a semiconductor device including the two MOS transistors, and a method for manufacturing the same.

The present invention also relates to a low-power semiconductor device in which $V_{th}$ (threshold voltage) values of the MOS transistors are controlled to provide excellent device characteristics, and a method for manufacturing the same.

BACKGROUND ART

As transistors have been continuously miniaturized, there have been problems of reduction in drive current (Ion) due to depletion of a polysilicon electrode and increase in gate leakage current due to reduction in thickness of a gate insulating film. To address such problems, there has been a proposal of a MOS transistor that prevents depletion of the gate electrode by using a metal gate electrode made of a metal or other materials and that uses high-dielectric insulating film as a gate insulator to increase its physical thickness and reduce the gate leakage current.

FIG. 1 shows such a semiconductor device. The semiconductor device shown in FIG. 1 includes planar nMOS transistor 21 and pMOS transistor 22. In the semiconductor device, p-type region 23 and n-type region 24 are present in silicon substrate 1.

N-type source/drain region 5 is present in p-type region 23, and silicide layer 6 is provided on source/drain region 5. Gate electrode 8 is provided above part of p-type region 23 with a gate insulating film therebetween. The gate insulating film is comprised of two layers: $SiO_2$ layer 47a on the p-type region 23 side and high-dielectric insulating film 47b on the gate electrode side. Further, gate sidewall 7 is provided on the side of gate electrode 8. P-type region 23, source/drain region 5, gate insulating films 47a, 47b, and gate electrode 8 form nMOS transistor 21.

Similarly, p-type source/drain region 5 is provided in n-type region 24. Gate insulating films 47a, 47b and gate electrode 9 are provided on part of n-type region 24, and gate sidewall 7 is provided on the side of gate electrode 9. N-type region 24, source/drain region 5, gate insulating films 47a, 47b, and gate electrode 9 form pMOS transistor 22.

In the semiconductor device including the planar MOS transistors shown in FIG. 1, it is a conventional practice to change the composition of gate electrodes 8 and 9 so as to control $V_{th}$ values of the MOS transistors. Use of a high-dielectric insulating film as the gate insulating film and metal silicide as the gate electrode allows Si atoms present in the gate electrode in the vicinity of the gate insulating film to interact with the gate insulating film (Fermi level pinning). As a result, the work function of the material that forms each of the gate electrodes changes, and $V_{th}$ changes accordingly.

It is therefore a conventional practice to control $V_{th}$ by changing the composition (Si content) of the metal silicide that forms the gate electrode of each of the MOS transistors to change the degree of the Fermi level pinning.

International Publication No. 2006/001271 and International Electron Device Meeting, Technical Digest, 2004, pp. 91-94 disclose a semiconductor device including pMOS and nMOS transistors that are formed by using a bulk substrate and include high-dielectric gate insulating films. In the semiconductor device, the gate electrode of the pMOS transistor is made of metal silicide having a high metal concentration and the gate electrode of the nMOS transistor is made of metal silicide having a high silicon concentration. The disclosed semiconductor device has a specific configuration in which the gate electrode of the nMOS transistor is made of NiSi or $NiSi_2$ and the gate electrode of the pMOS transistor is made of $Ni_3Si$.

Symposium on VLSI Technology, Technical Digest, 2005, pp. 86-87 discloses a semiconductor device using a bulk substrate. The semiconductor device is characterized by an HfSiON as high-dielectric gate insulating film, an $Ni_3Si$ gate electrode of a pMOS transistor, and an NiSi gate electrode of an nMOS transistor.

FIG. 2 shows another example of a semiconductor device of related art. FIG. 2(a) is a top view of the semiconductor device. FIG. 2(b) is a cross-sectional view of the semiconductor device in FIG. 2(a) taken along direction A-A. FIG. 2(c) is a cross-sectional view of the semiconductor device in FIG. 2(a) taken along direction B-B.

The semiconductor device shown in FIG. 2 includes fin-type MOS transistors including protruding semiconductor regions 23 and 24 protruding upward from embedded insulating film 11, and channel regions are formed in semiconductor regions 23 and 24. The semiconductor device is comprised of nMOS transistor 21 and pMOS transistor 22. In the semiconductor device, two protruding p-type region 23 and n-type region 24 are provided on embedded insulating film 11. Gate electrodes 8 and 9 are provided on both sides of p-type region 23 and n-type region 24, respectively.

N-type source/drain region 30a is provided in the both portions in protruding p-type region 23 sandwiching gate electrode 8, and p-type source/drain region 30b is provided in the both portions in protruding n-type region 24 sandwiching gate electrode 9. High-dielectric gate insulating films 47b are provided between p-type region 23 and gate electrode 8 and between n-type region 24 and gate electrode 9.

P-type region 23, source/drain region 30a, gate insulating film 47b, and gate electrode 8 form nMOS transistor 21. Similarly, n-type region 24, source/drain region 30b, gate insulating layer 47b, and gate electrode 9 form pMOS transistor 22.

When MOS transistors 21 and 22 shown in FIG. 2 are in operation, channel regions are formed on the sides of p-type region 23 and n-type region 24.

In the semiconductor device including fin-type MOS transistors shown in FIG. 2 as well, it is a conventional practice to control $V_{th}$ values of the MOS transistors by changing the composition (Si content) of gate electrodes 8 and 9 so as to change the degree of Fermi level pinning between gate electrodes 8, 9 and gate insulating films 47b.

In the planar MOS transistor and the fin-type MOS transistor described above, the semiconductor region in which a channel region is to be formed is thick (the length in the direction indicated by reference numeral 25 in FIG. 1 and the length in the direction indicated by reference numeral 26 in FIG. 2). Each of the MOS transistors described above, when operated, therefore functions as a partially depleted MOS transistor (PD-MOSFET) in which the body region is partially depleted.

On the other hand, in recent years, as mobile phone terminals or other apparatus have been equipped with increasingly advanced functions and used in increasingly various applications, there has been a demand for a low-power, high-speed device.

As a low-power, high-speed semiconductor device, a semiconductor device including a fully depleted MOS transistor (FD-MOSFET) in which the body region is fully depleted during operation has received attention.

A semiconductor device including such a MOS transistor can (1) operate at a lower power level due to improvement in S (sub-threshold swing) value, and (2) consume less power due to reduction in substrate leakage current. The semiconductor device can also (3) be faster due to reduction in substrate parasitic capacitance, and (4) operate at a higher speed due to reduction in channel dose (impurity concentration of $1 \times 10^{14}$ to $1 \times 10^{17}$ cm$^{-3}$) (improvement in mobility in a working voltage area). The device characteristics can therefore be greatly improved. Among the above device characteristics, the advantageous effect described in (4) allows the short channel effect in a low-channel-dose area to be suppressed, which is a significant advantage obtained by using a fully depleted MOS transistor.

DISCLOSURE OF THE INVENTION

As described above, a semiconductor device including a fully depleted MOS transistor including a metal gate electrode and a high-dielectric gate insulating film can operate at a low power level and improve mobility (operate at a higher speed) by lowering the channel dose. Lowering the channel dose, however, disadvantageously makes it difficult to control $V_{th}$.

Specifically, to achieve a low-power semiconductor device, it is necessary to set $V_{th}$ of a pMOS transistor to a value ranging from approximately −0.6 to −0.3 V and $V_{th}$ of an nMOS transistor to a value ranging from approximately 0.3 to 0.6 V. It is, however, very difficult to control $V_{th}$ of a fully depleted MOS transistor to fall within either of the above ranges by using conventional MOS transistor technologies and the technologies disclosed in International Publication No. 2006/001271 and International Electron Device Meeting, Technical Digest, 2004, pp. 91-94. The reason of this will be described below.

(1) To control $V_{th}$ of each of pMOS and nMOS transistors to be a value necessary for a low-power semiconductor device, it is necessary to control the composition of metal silicide that forms the gate electrode to be a specific composition, because in metal silicide, the metal content is linearly proportional to the work function. A slight discrepancy in composition (such as discrepancy in film thickness when the film is formed and discrepancy in composition in the plane direction) results in variation in work function. As a result, it becomes difficult to control $V_{th}$ to be a desired value. In particular, when a high-dielectric insulating film is used as the gate insulating film, the variation in work function further increases due to Fermi level pinning.

Therefore, in a silicide (metal gate) electrode formation method of related art in which a silicide film is deposited on a gate insulating film by using CVD or other methods, the variation of work function is large and it is difficult to control the composition of the gate electrodes in such a way that the pMOS and nMOS transistors have $V_{th}$ values in a range necessary to achieve a stable low-power semiconductor device.

(2) As indicated in International Publication No. 2006/001271 and International Electron Device Meeting, Technical Digest, 2004, pp. 91-94, for part of metal silicide, $V_{th}$ is stably controlled by using crystalline phase formation to control the composition of the metal silicide in a self-aligning manner. Specifically, in International Publication No. 2006/001271, in a partially depleted semiconductor device using a bulk substrate, the gate electrode of an nMOS transistor comprises an NiSi or NiSi$_2$ crystalline phase and the gate electrode of a pMOS transistor comprises an Ni$_3$Si crystalline phase.

As one method, in a fully depleted semiconductor device using an SOI substrate as well, it is conceivable that the gate electrode of an nMOS transistor comprises s an NiSi or NiSi$_2$ crystalline phase and the gate electrode of a pMOS transistor comprises an Ni$_3$Si crystalline phase, as in International Publication No. 2006/001271.

FIG. 4 shows, by dotted lines, results of computer simulation of the relationship between the channel impurity concentration and $V_{th}$ for planar MOS transistors, each of which is formed by using a bulk substrate and includes an Ni silicide gate electrode. FIGS. 4($a$) and 4($b$) show results for pMOS and nMOS transistors with gate electrodes made of Ni$_3$Si, Ni$_2$Si, NiSi, and NiSi$_2$. The simulation shows results when the gate length is 0.3 µm and the physical film thickness (converted into an SiO$_2$ film thickness) of the gate insulating film is 1.6 nm.

FIG. 4($a$) shows that for the pMOS transistor with the gate electrode made of Ni$_3$Si (dotted line), $V_{th}$ ranges from approximately −0.2 to 0 V in a low-channel-dose area ($1 \times 10^{14}$ to $1 \times 10^{16}$ cm$^{-3}$). The $V_{th}$ value therefore greatly falls outside the range between −0.6 and −0.3 V (hatched area), which is necessary for a low-voltage pMOS transistor.

FIG. 4($b$) shows that for the nMOS transistors with the gate electrodes made of NiSi and NiSi$_2$ (dotted lines), $V_{th}$ values range from 0 to 0.2 V in the low-channel-dose area ($1 \times 10^{14}$ to $1 \times 10^{16}$ cm$^{-3}$). The $V_{th}$ values therefore greatly fall outside the range between 0.3 and 0.6 V (hatched area), which is necessary for a low-voltage nMOS transistor.

As seen from the above facts, it is difficult to control $V_{th}$ to be a value necessary for a low-power semiconductor device by using semiconductor technologies of related art, such as that described in International Publication No. 2006/001271.

(3) Further, for the Ni suicide shown in International Publication No. 2006/001271, the relationship between the amount of channel dose and $V_{th}$ in a MOS transistor using a bulk substrate greatly differs from that in a MOS transistor using an SOI substrate even when the gate electrodes have the same composition.

For example, FIG. 7 in International Publication No. 2006/001271 (FIG. 3 in the present specification) shows the relationship between Ni/(Ni+Si) composition ratio and the work function in a semiconductor device that is manufactured by using a bulk substrate and includes Ni silicide as a gate electrode material made. As shown in FIG. 3 in the present specification, the work function increases as the Ni composition ratio increases due to Fermi level pinning.

This behavior is expressed by the dotted lines in the relationship between the amount of channel dose and $V_{th}$ in FIGS. 4($a$) and 4($b$) when a bulk substrate is used. Similarly, the solid lines in FIGS. 4($a$) and 4($b$) show the behavior when an SOI substrate is used (in this case, the gate length is 0.3 µm, the thickness of the semiconductor layer in which a channel region is formed is 15 nm, and the physical film thickness (converted into an SiO$_2$ film thickness) of the gate insulating film is 1.6 nm). Now, compare the relationship between the amount of channel dose and $V_{th}$ among the cases where the gate electrode is made of a variety of Ni silicides (Ni$_3$Si, Ni$_2$Si, NiSi, and NiSi$_2$) for the partially depleted MOS transistors using a bulk substrate (dotted lines) and the fully depleted MOS transistors using an SOI substrate (solid lines).

For bulk-substrate-based pMOS transistors (doted lines), $V_{th}$ greatly decreases as the channel impurity concentration increases irrespective of the type of Ni silicide used. In contrast, for SOI-substrate-based pMOS transistors (solid lines), although $V_{th}$ decreases as the channel impurity concentration increases, the tendency of the decrease greatly differs from that for the bulk-substrate-based pMOS transistors.

Specifically, although $V_{th}$ values for the bulk substrate coincide with those for the SOI substrate in the channel dose area ranging from approximately $2\times10^{16}$ to $1\times10^{17}$ cm$^{-3}$, $V_{th}$ values in lower-channel-dose areas of the bulk-substrate-based pMOS transistors are greater than those of the SOI-substrate-based pMOS transistors, while $V_{th}$ values in higher-channel-dose areas of the bulk-substrate-based pMOS transistors are smaller than those of the SOI-substrate-based pMOS transistors.

Similarly, for bulk-substrate-based nMOS transistors (doted lines), $V_{th}$ greatly increases as the channel impurity concentration increases irrespective of the type of Ni silicide used. In contrast, for SOI-substrate-based nMOS transistors (solid lines), although $V_{th}$ increases as the channel impurity concentration increases, the tendency of the increase differs at all from that for the bulk-substrate-based nMOS transistors.

Specifically, although $V_{th}$ values for the bulk substrate coincide with those for the SOI substrate in the channel dose area ranging from approximately $2\times10^{16}$ to $1\times10^{17}$ cm$^{-3}$, $V_{th}$ values in lower-channel-dose areas of the bulk-substrate-based nMOS transistors are smaller than those of the SOI-substrate-based nMOS transistors, while $V_{th}$ values in higher-channel-dose areas of the bulk-substrate-based nMOS transistors are greater than those of the SOI-substrate-based nMOS transistors.

As described above, the relationship between the amount of channel dose and $V_{th}$ for a fully depleted MOS transistor using an SOI substrate greatly differs from that for a partially depleted MOS transistor using a bulk substrate. This reason is that the thickness of the silicon layers (n-type or p-type region) that form the channel regions in a fully depleted MOS transistor and a partially depleted MOS transistor differs from each other, and hence the intensity of the electric field applied to the silicon layer to form the channel region when a gate voltage is applied differs in the above two MOS transistors. It is therefore very difficult to control $V_{th}$ by applying the technology of related art for controlling $V_{th}$ of a partially depleted MOS transistor to a fully depleted MOS transistor.

To address the problem, the present inventor has intensively conducted studies on a variety of metal gate electrode materials and found that metal silicide having a specific composition may be preferably used as the gate electrode material of each of the pMOS and nMOS transistors. That is, the present inventor has found that in the thus configured semiconductor device, $V_{th}$ values of the nMOS and pMOS transistors can be controlled to values necessary for a low-power device, resulting in a semiconductor device with excellent device characteristics and reliability.

To solve the above problems, the present invention is characterized by the following configurations.

The present invention relate to a semiconductor device, comprising:
a support substrate;
an oxide film layer formed on the support substrate; and
an nMOS transistor and a pMOS transistor formed on the oxide film layer,
wherein the pMOS transistor is a fully depleted MOS transistor,
the pMOS transistor comprising:
the n-type region formed on the oxide film layer;
a first gate insulating film formed on the n-type region, the first gate insulating film including a high-dielectric insulating film; a first gate electrode formed on the first gate insulating film, the first gate electrode including silicide region (1) in contact with the first gate insulating film, the silicide region (1) comprising at least one type of crystalline phase selected from the group consisting of a WSi$_2$ crystalline phase, an MoSi$_2$ crystalline phase, an NiSi crystalline phase, and an NiSi$_2$ crystalline phase; and
a source/drain region formed throughout on both portions in the n-type region sandwiching the first gate electrode in the direction of a normal to the surface where the n-type region is in contact with the first gate insulating film, and
the nMOS transistor is a fully depleted MOS transistor,
the nMOS transistor comprising:
a p-type region formed on the oxide film layer;
a second gate insulating film formed on the p-type region, the second gate insulating film including a high-dielectric insulating film;
a second gate electrode formed on the second gate insulating film, the second gate electrode including silicide region (2) in contact with the second gate insulating film, the silicide region (2) comprising at least one type of crystalline phase selected from the group consisting of a PtSi crystalline phase, a Pt$_2$Si crystalline phase, an IrSi crystalline phase, an Ni$_2$Si crystalline phase, and an Ni$_3$Si crystalline phase; and
a source/drain region formed throughout on both portions in the p-type region sandwiching the second gate electrode in the direction of a normal to the surface where the p-type region is in contact with the second gate insulating film.

The present invention relate to a semiconductor device, comprising:
a support substrate;
an oxide film layer formed on the support substrate; and
an nMOS transistor and a pMOS transistor formed on the oxide film layer, wherein the pMOS transistor comprising:
an n-type region formed on the oxide film layer;
a first gate insulating film formed on the n-type region, the first gate insulating film including a high-dielectric insulating film;
a first gate electrode formed on the first gate insulating film, the first gate electrode including silicide region (1) in contact with the first gate insulating film, the silicide region (1) comprising at least one type of crystalline phase selected from the group consisting of a WSi$_2$ crystalline phase, an MoSi$_2$ crystalline phase, an NiSi crystalline phase, and an NiSi$_2$ crystalline phase; and
a source/drain region formed throughout on both portions in the n-type region sandwiching the first gate electrode in the direction of a normal to the surface where the n-type region is in contact with the first gate insulating film,
the length of the n-type region in the direction of the normal to the surface where the n-type region is in contact with the first gate insulating film is one-fourth of a gate length of the pMOS transistor or smaller, and
the nMOS transistor comprising:
a p-type region formed on the oxide film layer;
a second gate insulating film formed on the p-type region, the second gate insulating film including a high-dielectric insulating film;
a second gate electrode formed on the second gate insulating film, the second gate electrode including silicide region (2) in contact with the second gate insulating film, the silicide region (2) comprising at least one type of crystalline phase selected from the group consisting of a PtSi crystalline phase, a Pt$_2$Si crystalline phase, an IrSi crystalline phase, an Ni$_2$Si crystalline phase, and an Ni$_3$Si crystalline phase; and
a source/drain region formed throughout on both portions in the p-type region sandwiching the second gate electrode in the direction of a normal to the surface where the p-type region is in contact with the second gate insulating film, the length of the p-type region in the direction of the normal to the surface where the p-type region is in contact with the second gate insulating film is one-fourth of a gate length of the nMOS transistor or smaller.

The present invention relate to a semiconductor device, comprising:

a support substrate;

an oxide film layer formed on the support substrate; and a pMOS transistor formed on the oxide film layer, wherein the pMOS transistor is a fully depleted MOS transistor, the pMOS transistor comprising:

an n-type region formed on the oxide film layer;

a first gate insulating film formed on the n-type region, the first gate insulating film including a high-dielectric insulating film;

a first gate electrode formed on the first gate insulating film, the first gate electrode including silicide region (1) in contact with the first gate insulating film, the silicide region (1) comprising at least one type of crystalline phase selected from the group consisting of a $WSi_2$ crystalline phase, an $MoSi_2$ crystalline phase, an NiSi crystalline phase, and an $NiSi_2$ crystalline phase; and a source/drain region formed throughout on both portions in the n-type region sandwiching the first gate electrode in the direction of a normal to the surface where the n-type region is in contact with the first gate insulating film.

The present invention relate to a semiconductor device comprising:

a support substrate;

an oxide film layer formed on the support substrate; and an nMOS transistor formed on the oxide film layer, wherein the nMOS transistor is a fully depleted MOS transistor, the nMOS transistor comprising:

a p-type region formed on the oxide film layer;

a second gate insulating film formed on the p-type region, the second gate insulating film including a high-dielectric insulating film;

a second gate electrode formed on the second gate insulating film, the second gate electrode including silicide region (2) in contact with the second gate insulating film, the silicide region (2) comprising at least one type of crystalline phase selected from the group consisting of a PtSi crystalline phase, a $Pt_2Si$ crystalline phase, an IrSi crystalline phase, an $Ni_2Si$ crystalline phase, and an $Ni_3Si$ crystalline phase; and a source/drain region formed throughout on both portions in the p-type region sandwiching the second gate electrode in the direction of a normal to the surface where the p-type region is in contact with the second gate insulating film.

It is possible to provide a MOS transistor that consumes a low power and can operate at a high speed (nMOS transistor, pMOS transistor, CMOS transistor). Specifically, a MOS transistor with suppressed short-channel effect and improved mobility by lowering channel dose in the semiconductor channel region, reduced parasitic capacitance and substrate leakage current, is to be formed.

Further, the gate electrodes of the nMOS transistor and the pMOS transistor made of specific silicide materials allow the work functions of the gate electrode materials to be controlled to desired values. It is therefore possible to provide a semiconductor device with excellent device characteristics and reliability in which $V_{th}$ values of the nMOS transistor and the pMOS transistor are controlled to be desired values.

BRIEF DESCRIPTION OF THE DRAWINGS

FIG. 7 shows an example of a method for manufacturing a semiconductor device of the present invention;

FIG. 8 shows an example of a method for manufacturing a semiconductor device of the present invention;

FIG. 9 shows an example of a method for manufacturing a semiconductor device of the present invention;

FIG. 11 shows an example of a method for manufacturing a semiconductor device of the present invention;

FIG. 18 shows an example of a method for manufacturing a semiconductor device of the present invention;

FIG. 19 shows an example of a method for manufacturing a semiconductor device of the present invention;

FIG. 21 shows an example of a method for manufacturing a semiconductor device of the present invention;

Figure 1:
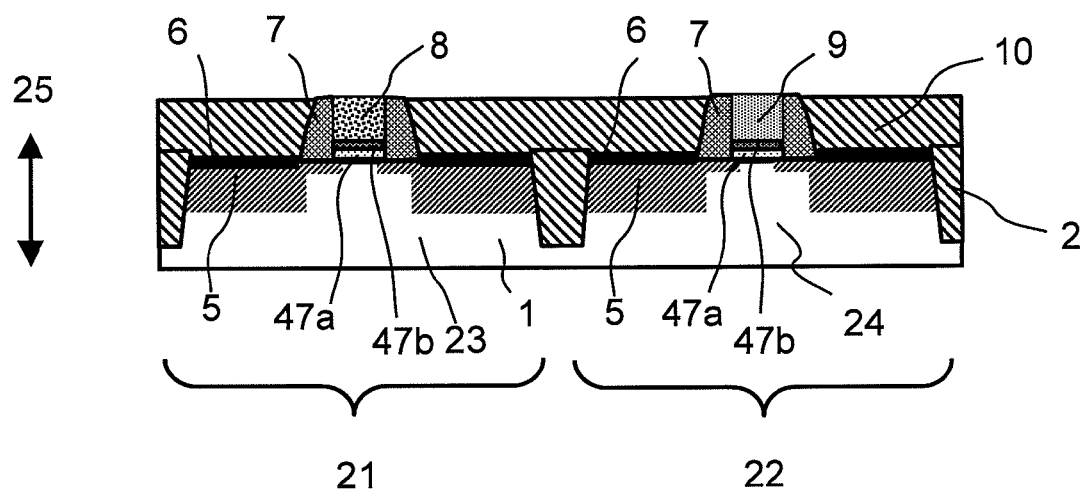
FIG. 1 shows a semiconductor device of related art.

In the drawings, numerals have the following meanings. 1: support substrate, 2: isolation region, 3a, 3b: second gate insulating film, 3c, 3d: first gate insulating film, 3e: dummy gate insulating film, 4: extension diffusion region, 5: source/drain region, 6, 32: silicide layer, 7: gate sidewall, 8, 9: gate electrode, 9a: second gate electrode, 9b: first gate electrode, 10: interlayer insulating film, 11: embedded insulating film, 14a: second gate electrode material, 14b: first gate electrode material, 14c: dummy gate electrode, 15, 15a, 15b: mask, 16:

metal layer, 18: high-dielectric film layer, 19: SiO₂ film layer, 21: nMOS transistor, 22: pMOS transistor, 23: p-type region, 24: n-type region, 30a: n-type source/drain region, 30b: p-type source/drain region, 36, 37, 38: mask, 41a: silicide region (2), 41b, 41d: low-resistance layer, 41c: silicide region (1), 42: semiconductor layer, 43: polysilicon layer, 47a, 47b: gate insulating film, 51: Ni layer, 52: silicon layer, 53: tungsten film, 54: WSi₂ film.

BEST MODE FOR CARRYING OUT THE INVENTION (Semiconductor Device)

In an exemplary embodiment of the present invention, a semiconductor device includes an nMOS transistor. In another exemplary embodiment, a semiconductor device includes a pMOS transistor. In still another exemplary embodiment, a semiconductor device includes nMOS and pMOS transistors.

Each of the MOS transistors is formed by using an SOI substrate and becomes a fully depleted MOS transistor. The gate insulating film of each of the MOS transistors includes at least one high-dielectric gate insulating film. Further, the gate electrode constituting each of the MOS transistors includes a silicide region that comprises a specific crystalline phase and is in contact with the gate insulating film.

Specifically, a first gate electrode includes silicide region (1) in contact with a first gate insulating film, silicide region (1) comprising at least one type of crystalline phase selected from the group consisting of a WSi₂ crystalline phase, an MoSi₂ crystalline phase, an NiSi crystalline phase, and an NiSi₂ crystalline phase. A second gate electrode includes silicide region (2) in contact with a second gate insulating film, silicide region (2) comprising at least one type of crystalline phase selected from the group consisting of a PtSi crystalline phase, a Pt₂Si crystalline phase, an IrSi crystalline phase, an Ni₂Si crystalline phase, and an Ni₃Si crystalline phase. Silicide region (1) typically comprises any of a WSi₂ crystalline phase, an MoSi₂ crystalline phase, an NiSi crystalline phase, and an NiSi₂ crystalline phase. Silicide region (2) typically comprises any of a PtSi crystalline phase, a Pt₂Si crystalline phase, an IrSi crystalline phase, an Ni₂Si crystalline phase, and an Ni₃Si crystalline.

It is a conventional practice to control $V_{th}$ (threshold voltage) by controlling the composition of the gate electrode material. It is however difficult to control the gate electrode material to have a specific composition, and it is hence difficult to stably control $V_{th}$ to be a value necessary for a low-power semiconductor device because the composition of the gate electrode material has a great influence on $V_{th}$. Although studies on technologies for controlling the gate electrode material to have a specific composition have been conducted for some metal silicide materials, such technologies relate to partially depleted MOS transistors using bulk substrates, and it is difficult to apply such technologies to fully depleted MOS transistors using SOI substrates that have completely different characteristics.

To address the problem, in the present invention, the first and second gate electrodes comprising crystalline phases of specific compositions allow $V_{th}$ values to fall within a range necessary for a low-power semiconductor device in a stable manner. As a result, a semiconductor device with excellent device characteristics and reliability can be provided.

By making a MOS transistor to be a fully depleted type, the present invention thus provides the MOS transistor characterized by low power and high mobility (high-speed operation). Specifically, for example, the power consumption can be reduced by 30% and the performance can be increased (operated at higher speeds) by 30% as compared to related art.

Further, since the gate insulating film is comprised of a high-dielectric insulating film, the high-dielectric material in the gate insulating film interacts with Si atoms in the gate electrode in the vicinity of the gate insulating film (Fermi level pinning). As a result, the effective work function of the gate electrode greatly changes as the Si composition of the material that forms the gate electrode changes. Configuring the gate electrode to have any of the compositions described above and using Fermi level pinning therefore allow $V_{th}$ of each MOS transistor to be controlled to a desired value.

In a semiconductor device of the present invention, each of the MOS transistors may be a planar MOS transistor or a fin-type MOS transistor. When a fin-type MOS transistor is used, the gate insulating film and the gate electrode are formed only on the side of a protruding semiconductor region, and a channel region is to be formed only on the side of the semiconductor region.

In an exemplary embodiment of the present invention, a semiconductor device is comprised of an nMOS transistor and a pMOS transistor. The MOS transistors may be planar MOS transistors or fin-type MOS transistors. Alternatively, an nMOS transistor and a pMOS transistor may form a CMOS transistor. Still alternatively, one of the MOS transistors may be a planar MOS transistor, and the other may be a fin-type MOS transistor.

First Exemplary Embodiment

Figure 5:
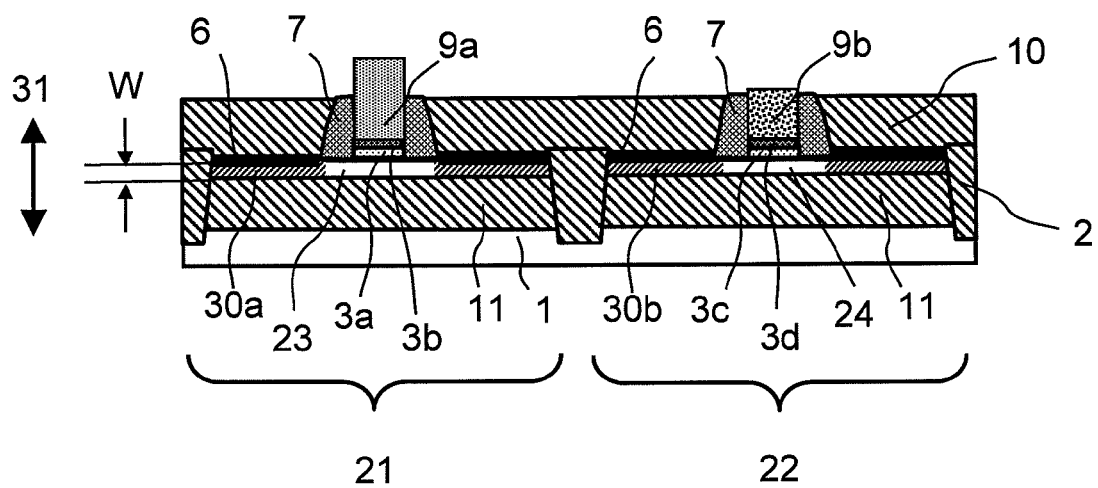
FIG. 5 shows an example of a semiconductor device of the present invention.

FIG. 5 shows an example of a semiconductor device including an nMOS transistor and a pMOS transistor according to the present invention. FIG. 5 shows a semiconductor device in which an n-type region, a p-type region, and an isolation region form a single plane and first and second gate electrodes are provided on the plane so that planar MOS transistors are formed. The semiconductor device is formed by using an SOI substrate including support substrate 1, embedded insulating film 11, and semiconductor layer.

P-type region (p-type active region: p-well) 23 is provided in the semiconductor layer. A second gate insulating film and second gate electrode 9a are provided on part of p-type region 23. The second gate insulating film is comprised of two layers: SiO₂ film 3a on the embedded insulating film 11 side and high-dielectric insulating film (HfSiON film) 3b on the second gate electrode 9a side. Gate sidewall 7 is provided on the side of second gate electrode 9a. Entire second gate electrode 9a is comprised of silicide region (2). Silicide region (2) comprises at least one type of crystalline phase selected from the group consisting of a PtSi crystalline phase, a Pt₂Si crystalline phase, an IrSi crystalline phase, an Ni₂Si crystalline phase, and an Ni₃Si crystalline phase.

Further, n-type source/drain region 30a is provided on both sides in p-type region 23 sandwiching a second gate electrode 9a. Source/drain region 30a is formed throughout p-type region 23 all along the direction of a normal to the surface where the p-type region is in contact with the second gate insulating film (the direction of a normal to embedded insulating film 11, the direction indicated by reference numeral 31 in FIG. 5). Silicide layer 6 is formed on n-type source/drain region 30a. P-type region 23, the second gate insulating film, second gate electrode 9a, and n-type source/drain region 30a form nMOS transistor 21.

Similarly, a first gate insulating film and first gate electrode 9b are provided on part of n-type region (n-type active region: n-well) 24, and gate sidewall 7 is provided on the side of first gate electrode 9b. The first gate insulating film is comprised of two layers: $SiO_2$ film 3c and high-dielectric insulating film (HfSiON film) 3d. Entire first gate electrode 9b is comprised of silicide region (1). Silicide region (1) comprises at least one type of crystalline phase selected from the group consisting of a $WSi_2$ crystalline phase, an $MoSi_2$ crystalline phase, an NiSi crystalline phase, and an $NiSi_2$ crystalline phase.

P-type source/drain region 30b is provided on both sides in n-type region 24 sandwiching a first gate electrode 9b. Source/drain region 30b is formed throughout n-type region 24 all along the direction of a normal to the surface where the n-type region is in contact with the first gate insulating film (the direction of a normal to embedded insulating film 11, the direction indicated by reference numeral 31 in FIG. 5). N-type region 24, the first gate insulating film, first gate electrode 9b, and p-type source/drain region 30b form pMOS transistor 22.

The thickness (the length in the direction indicated by reference numeral 31 in FIG. 5) W of p-type region 23 and n-type region 24 is thin. Therefore, when each of the MOS transistors is in operation, the body region in the source/drain region is fully depleted. The thickness of p-type region 23 and n-type region 24 (the length of p-type region 23 and n-type region 24 in the direction of a normal to the surface where p-type region 23 and n-type region 24 are in contact with the second and first gate insulating films, respectively) W preferably ranges from 5 to 20 nm, more preferably 5 to 10 nm.

In the semiconductor device, since each of p-type region 23 and n-type region 24 is thin, it is not necessary to form a separate extension region in the source/drain region by controlling impurity implantation conditions. Therefore, each of the MOS transistors comprises no extension region, and the entire active portion on both sides of the gate electrode and the gate sidewall is the source/drain region. That is, the source/drain region is present all along the thickness direction 31 so that the source/drain region is in contact with both silicide 6 and embedded insulating film 11.

First gate electrode 9b and second gate electrode 9a may or may not be electrically connected to each other. When they are electrically connected to each other, it is necessary to form the gate electrodes (silicidation) in such a way that one of the gate electrode constituent materials will not diffuse into the other gate electrode constituent materials so as not to cause shift in composition of both the gate electrode materials from desired composition.

Second Exemplary Embodiment

Figure 26:
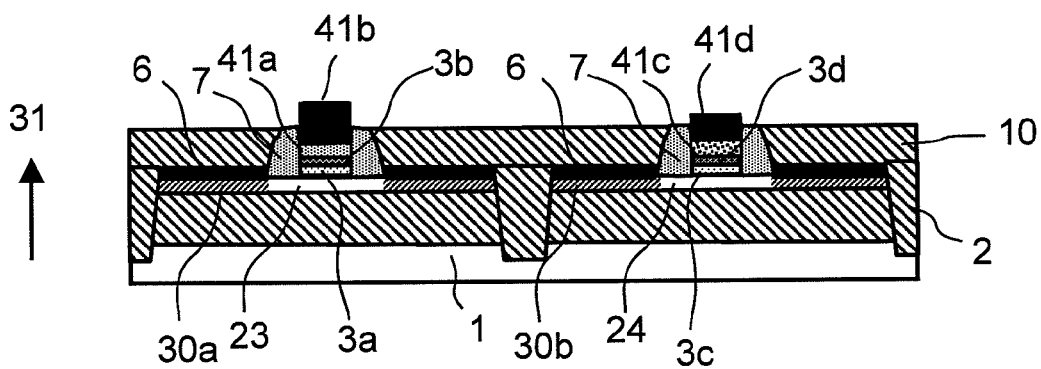
FIG. 26 shows an example of a semiconductor device of the present invention.

FIG. 26 shows a variation of the first exemplary embodiment. The semiconductor device of the present exemplary embodiment differs from that in the first exemplary embodiment in that each of the first and second gate electrodes is comprised of two layers: a silicide region on the gate insulating film side and a low-resistance layer as a top layer on the silicide region (on the side opposite the gate insulating film side, as the uppermost layer in the direction indicated by reference numeral 31 in FIG. 26). In the semiconductor device shown in FIG. 26, the second gate electrode is comprised of silicide region (2) 41a and low-resistance layer 41b. Silicide region (2) 41a is provided on the high-dielectric insulating film 3b side, and low-resistance layer 41b is provided as a top layer on silicide region (2) 41a. Similarly, the first gate electrode is comprised of silicide region (1) 41c and low-resistance layer 41d. Silicide region (1) 41c is provided on the high-dielectric insulating film 3d side, and low-resistance layer 41d is provided as a top layer on silicide region (1) 41c.

The "low-resistance layer" refers to, when each of the first and second gate electrodes is comprised of two or more layers, a layer having an electric resistance value lower than those of silicide regions (1) and (2) provided on the first and second gate insulating film sides, respectively (in contact with the first and second gate insulating films). Providing such a low-resistance layer allows the contact resistance between the gate electrode and wiring to be effectively reduced.

The low-resistance layer provided in the first gate electrode may be made of the same material as that of the low-resistance layer provided in the second gate electrode, or may be made of a material different from that of the low-resistance layer provided in the second gate electrode. Alternatively, a low-resistance layer may be provided in only one of the first and second gate electrodes.

The low-resistance layer provided in the second gate electrode preferably comprises, for example, an NiSi crystalline phase when silicide region (2) comprises at least one of an $Ni_2Si$ crystalline phase and an $Ni_3Si$ crystalline phase. The low-resistance layer provided in the first gate electrode preferably comprises, for example, an NiSi crystalline phase when silicide region (1) comprises an $NiSi_2$ crystalline phase. When silicide region (1) comprises an NiSi crystalline phase and hence already has quite a low resistance, no low-resistance layer may be formed thereon. Other examples of material for the low-resistance layer may include $CoSi_2$, $TiSi_2$, and $WSi_2$.

Third Exemplary Embodiment

Figure 2:
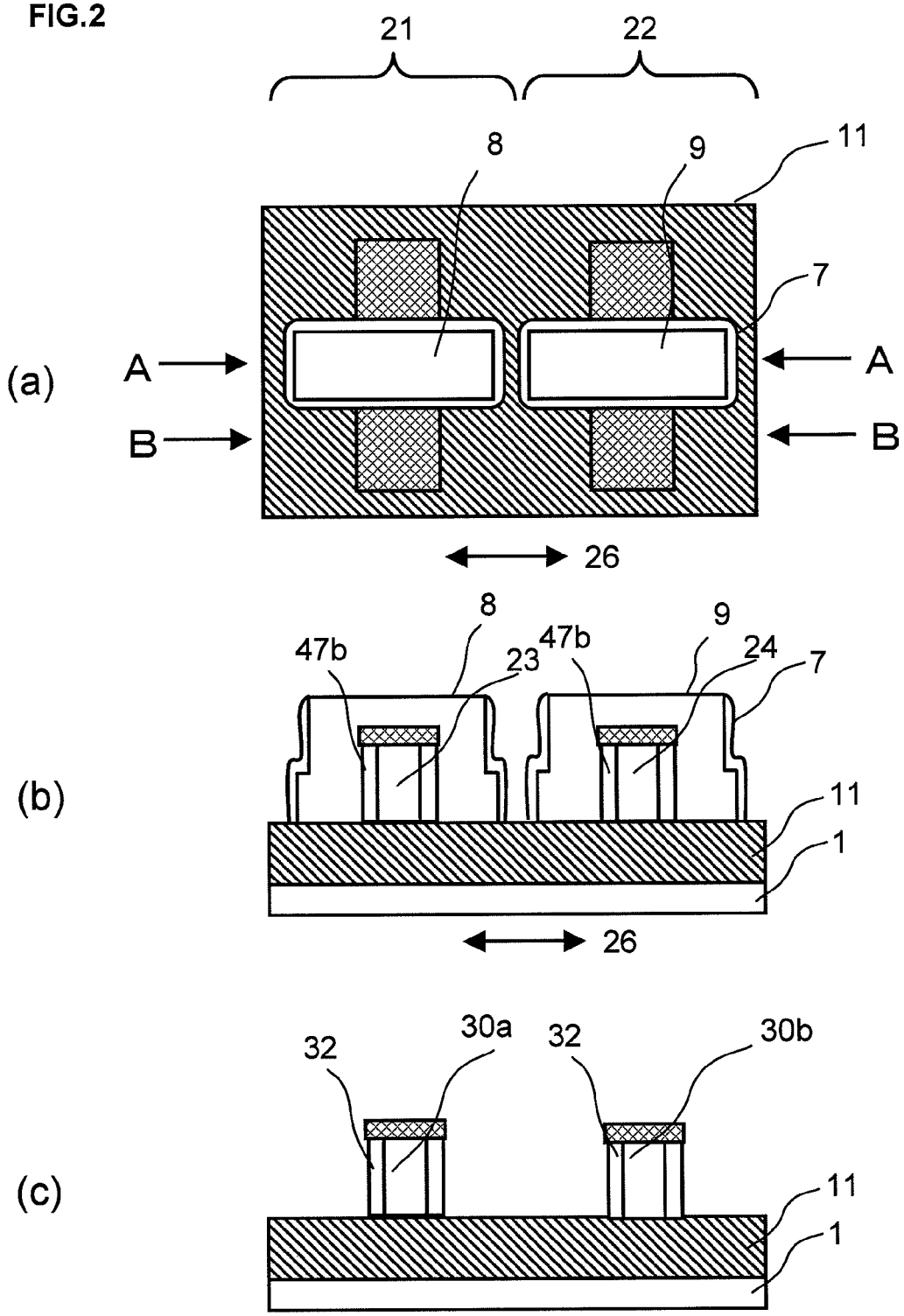
FIG. 2 shows a semiconductor device of related art.
Figure 3:
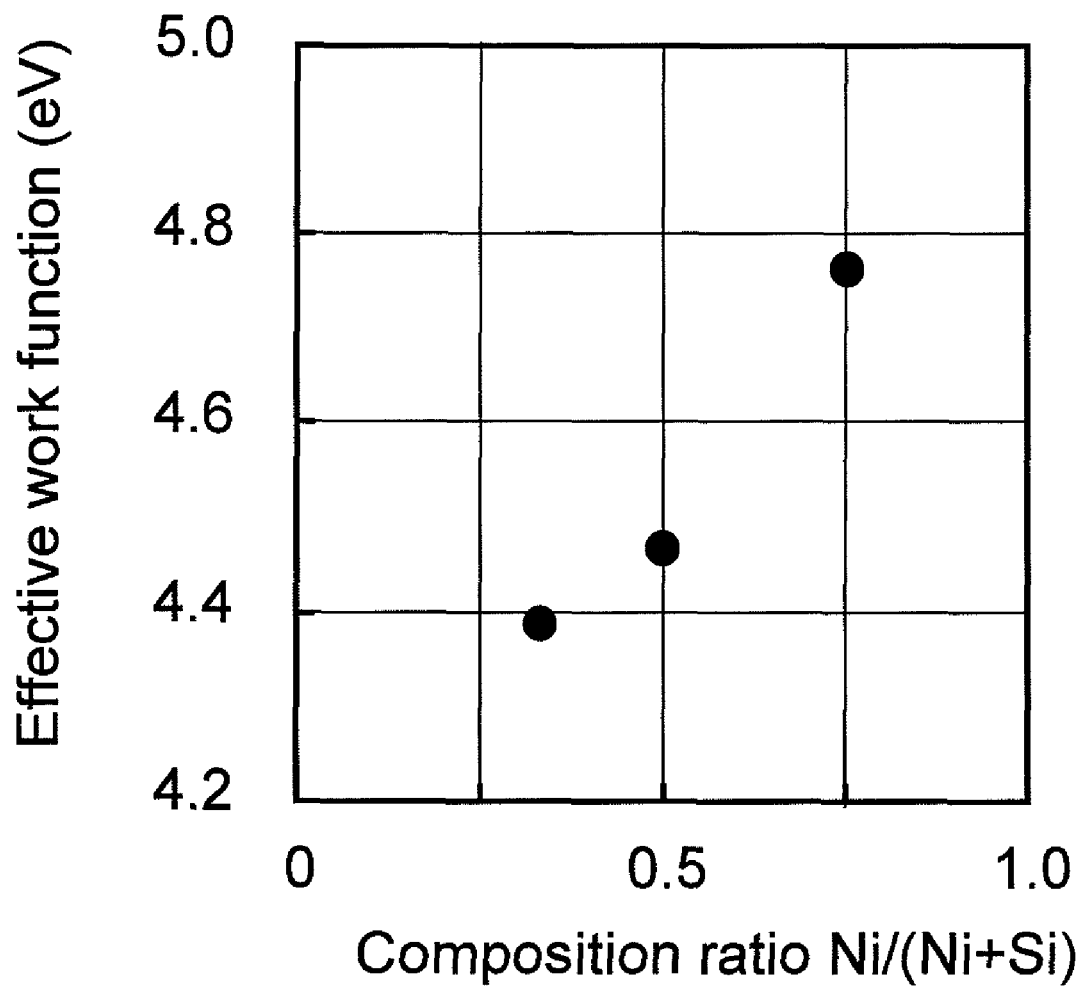
FIG. 3 shows the relationship between the Ni composition and the effective work function in a gate electrode of a semiconductor device of related art.
Figure 6:
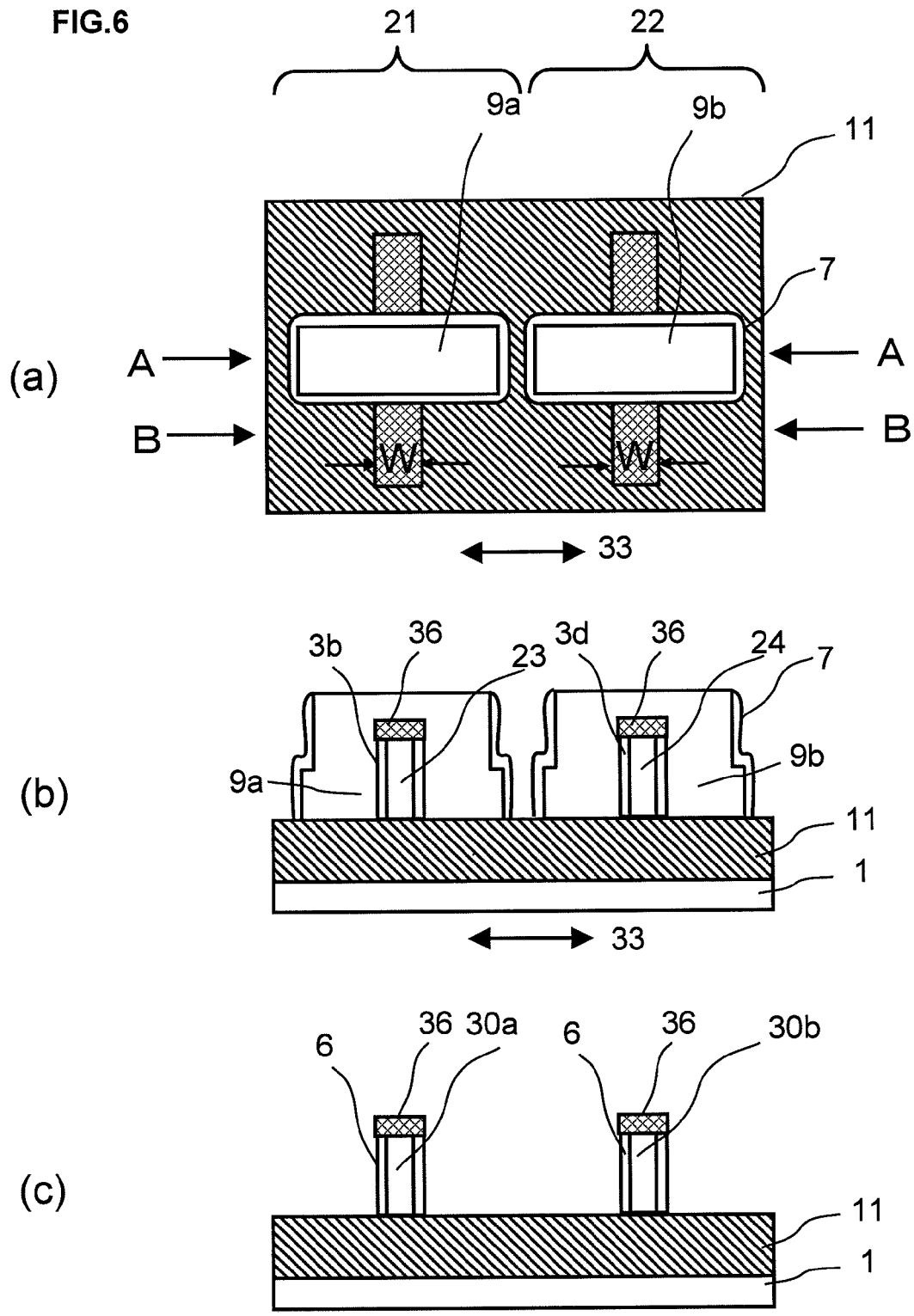
FIG. 6 shows an example of a semiconductor device of the present invention.
Figure 10:
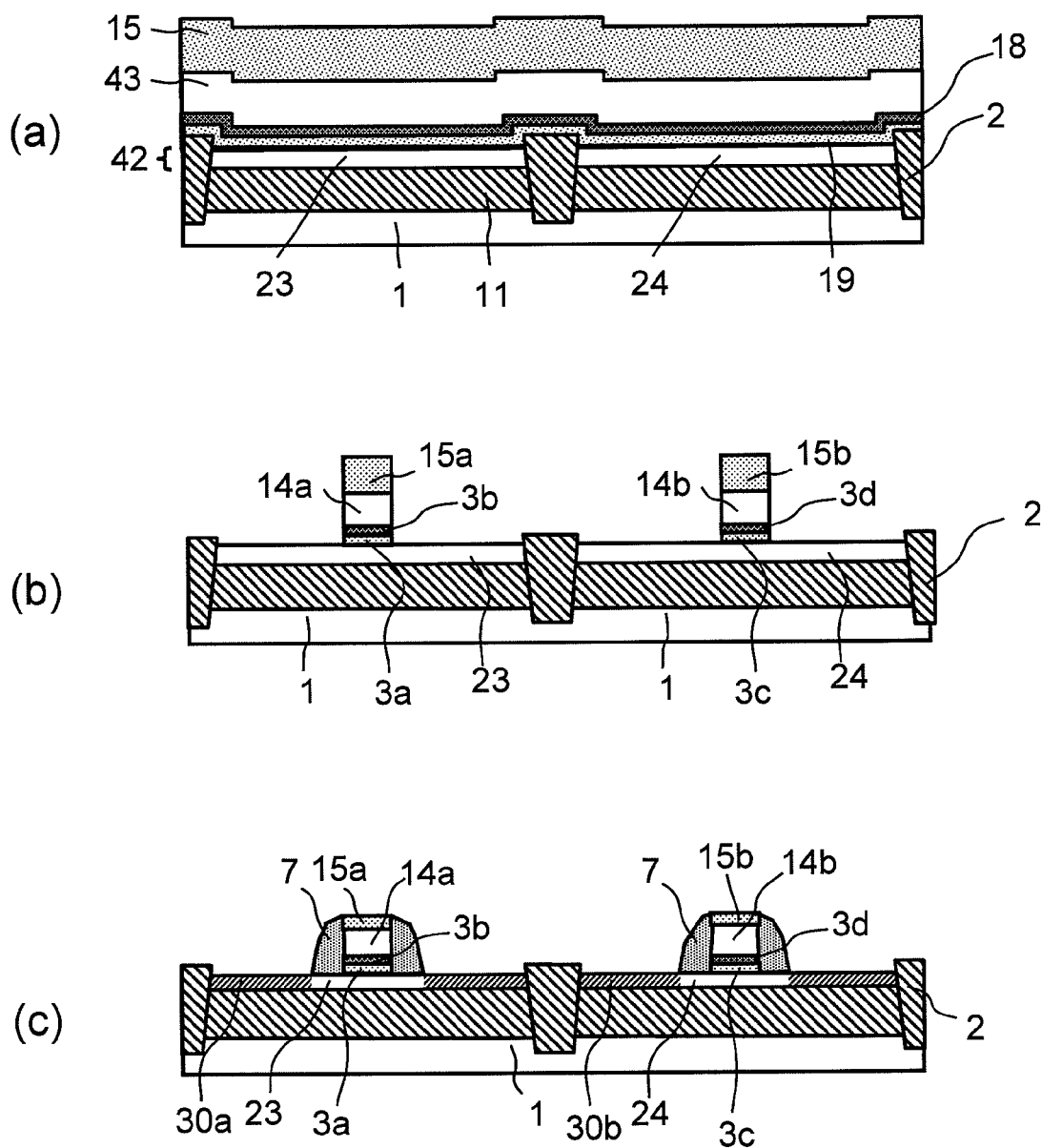
FIG. 10 shows an example of a method for manufacturing a semiconductor device of the present invention.
Figure 12:
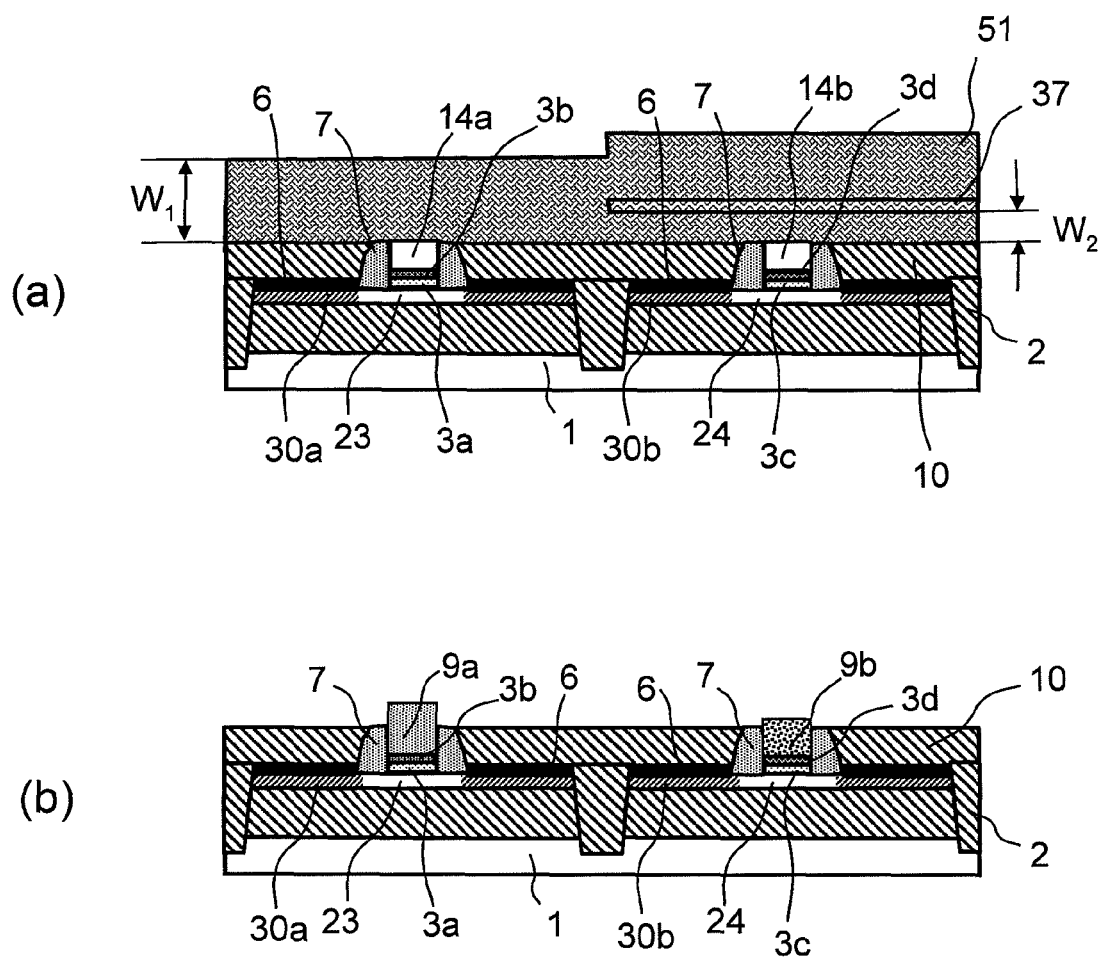
FIG. 12 shows an example of a method for manufacturing a semiconductor device of the present invention.

FIG. 6 shows another example of a semiconductor device including an nMOS transistor and a pMOS transistor according to the present invention. FIG. 6 shows a semiconductor device including fin-type MOS transistors. FIG. 6(a) is a top view of the semiconductor device. FIG. 6(b) is a cross-sectional view of the semiconductor device in FIG. 6(a) taken along direction A-A. FIG. 6(c) is a cross-sectional view of the semiconductor device in FIG. 6(a) taken along direction B-B. The semiconductor device differs from the semiconductor device shown in FIG. 2, for example, in that the width W (the length in the direction indicated by reference numeral 33) of n-type region 23 and p-type region 24 is narrower, each of the MOS transistors is fully depleted, and the material that form each of the gate electrodes has specific composition.

The semiconductor device is formed by using a substrate including support substrate 1, embedded insulating film 11, and a semiconductor layer. Protruding p-type region 23 is provided on embedded insulating film 11 to form a protruding semiconductor region, and second gate electrode 9a is provided on both sides of p-type region 23. The shape of the protruding semiconductor region (n-type region, p-type region) is not particularly limited as long as there are both sides. Typical examples of the shape may include a box-like shape and a substantially box-like shape. Second gate insulating film 3b is provided between the side of p-type region 23 and second gate electrode 9a. Second gate insulating film 9b is comprised of a high-dielectric insulating film (HfSiON film). Second gate insulating film 9b may be comprised of two or more layers, but at least one of the layers needs to be a high-dielectric insulating film.

Second gate electrode 9a includes silicide region (2) in contact with second gate insulating film 3b. That is, silicide region (2) is provided on both sides of p-type region 23. Silicide region (2) comprises at least one type of crystalline phase selected from the group consisting of a PtSi crystalline phase, a $Pt_2Si$ crystalline phase, an IrSi crystalline phase, an Ni$_2$Si crystalline phase, and an Ni$_3$Si crystalline phase. Gate sidewall 7 is provided on the side of second gate electrode 9a.

N-type source/drain region 30a is provided on both sides in p-type region 23 sandwiching second gate electrode 9a. Insulating film layer 36 is provided on top surface of n-type source/drain region 30a. P-type region 23, second gate insulating film 3b, source/drain region 30a, and second gate electrode 9a form nMOS transistor 21.

Similarly, protruding n-type region 24 is provided on embedded insulating film 11. First gate insulating film 3d and first gate electrode 9b are provided on both sides of n-type region 24. First gate insulating film 3d is comprised of a high-dielectric insulating film (HfSiON film). First gate insulating film 3d may be comprised of two or more layers, but at least one of the layers needs to be a high-dielectric insulating film.

First gate electrode 9b includes silicide region (1) in contact with first gate insulating film 3d. That is, silicide region (1) is provided on both sides of n-type region 24. The silicide region comprises at least one type of crystalline phase selected from the group consisting of a WSi$_2$ crystalline phase, an MoSi$_2$ crystalline phase, an NiSi crystalline phase, and an NiSi$_2$ crystalline phase. Gate sidewall 7 is provided on the side of first gate electrode 9b.

P-type source/drain region 30b is provided on both sides in n-type region 24 sandwiching first gate electrode 9b.

N-type region 24, first gate insulating film 3d, source/drain region 30b, and first gate electrode 9b form pMOS transistor 22.

In each of the MOS transistors of the present exemplary embodiment, the gate electrode is provided on the side of the protruding semiconductor region with the gate insulating film therebetween. Channel regions are therefore formed only on the sides of p-type region 23 and n-type region 24.

In the semiconductor device, the thickness W (the length in the direction indicated by the reference numeral 33 in FIG. 6) of p-type region 23 and n-type region 24 is thin. Therefore, when each of the MOS transistors is in operation, the body region in the source/drain region is fully depleted. The thickness W of each of the semiconductor regions (the length of p-type region 23 and n-type region 24 in the direction of a normal to the surface where p-type region 23 and n-type region 24 are in contact with the second and first gate insulating films, respectively) preferably ranges from 5 to 20 nm, more preferably 5 to 10 nm, still more preferably 5 to 7 nm so that the body region is depleted in a stable manner.

First gate electrode 9b and second gate electrode 9a may or may not be electrically connected to each other. When they are electrically connected to each other, it is necessary to form the gate electrodes (silicidation) in such a way that of one of the gate electrode constituent materials will not diffuse into the other gate electrode so as not to cause shift in composition of both the gate electrode materials from desired composition.

(Full Depletion)

Whether a semiconductor device is fully depleted or partially depleted depends on the relationship of the film thickness L1 of the semiconductor layer (n-type region, p-type region) in which the channel region is to be formed (the width W in the direction indicated by reference numeral 31 in FIG. 5, the width W in the direction indicated by reference numeral 33 in FIG. 6) with a maximum depletion layer width L2. That is, when the film thickness L1 of the semiconductor layer is smaller than the maximum depletion layer width L2, the semiconductor device becomes partially depleted, whereas the film thickness L1 of the semiconductor layer is greater than the maximum depletion layer width L2, the semiconductor device becomes fully depleted.

In a planar MOS transistor, the film thickness L1 refers to the thickness in the thickness direction (the direction of a normal to the oxide film layer, the length of p-type region 23 in the direction of a normal to the surface where p-type region 23 is in contact with the second gate insulating film, the length of n-type region 24 in the direction of a normal to the surface where n-type region 24 is in contact with the first gate insulating film). In a fin-type MOS transistor, the film thickness L1 refers to the length of the semiconductor region in the direction of a normal to the surface where the semiconductor region is in contact with the gate insulating film (the length in the direction of a normal to the gate electrode, the length in the direction parallel to the embedded insulating film but perpendicular to the direction of the gate length, the length in the direction parallel to the embedded insulating film but perpendicular to the direction of the channel length).

The maximum depletion layer width L2 is given by the following equations (1) and (2):

$$L2 = (2\epsilon_{Si}\epsilon_O 2\phi_F/qN_A)^{1/2} \quad (1)$$

$$\phi_F = (kT/q)\ln(N_A/n_i) \quad (2)$$

(In the equations, $\epsilon_{Si}$: relative dielectric constant of silicon, $\epsilon_O$: dielectric constant in vacuum, q: elementary electric charge, $N_A$: impurity concentration in semiconductor region, k: Boltzmann constant, T: temperature, $n_i$: intrinsic carrier concentration)

Therefore, to cause a MOS transistor to be fully depleted, the film thickness L1 of the semiconductor layer and the impurity concentration $N_A$ may be controlled. In a semiconductor device of the present invention, however, to suppress the short-channel effect and improve the mobility at a low power level, it is necessary to set the impurity concentration $N_A$ in the channel region to a low value (typically, the impurity concentration ranges from $1\times10^{14}$ to $1\times10^{17}$ cm$^{-3}$).

In the present invention, $N_A$ in the equations (1) and (2) is therefore set to a low concentration value, and the maximum depletion layer width L2 is set to a value within a predetermined range accordingly. A MOS transistor can therefore be fully depleted by controlling the film thickness L1 of the semiconductor region.

In such a fully depleted MOS transistor, using an SOI structure (in which the silicon layer on the oxide film is thin) can suppress the short-channel effect. In this way, the short-channel effect in a miniature transistor can be suppressed in a low-channel-concentration area, which has been difficult in a partially depleted MOS transistor using a bulk substrate of related art. As a result, device characteristics can be greatly improved.

Typically, each MOS transistor can be reliably fully depleted when the following conditions are satisfied:

(a) For a pMOS transistor, the length of the n-type region in the direction of a normal to the surface where the n-type region is in contact with the first gate insulating film is one-fourth of the gate length or smaller.

(b) For an nMOS transistor, the length of the p-type region in the direction of a normal to the surface where the p-type region is in contact with the second gate insulating film is one-fourth of the gate length or smaller.

(c) For a semiconductor device including a pMOS transistor and an nMOS transistor, the length of the n-type region in the direction of a normal to the surface where the n-type region is in contact with the first gate insulating film is one-fourth of the gate length or smaller and the length of the p-type region in the direction of a normal to the surface where the p-type region is in contact with the second gate insulating film is one-fourth of the gate length or smaller.

Typical dimensions of each MOS transistor (planar MOS transistor, fin-type MOS transistor) that forms a semiconductor device of the present invention are shown as follows:

(Planar Mos Transistor)
Gate length: 10 to 50 nm
Thickness of gate insulating film: 1 to 5 nm
(Fin-Type Mos Transistor)
Height H of protruding n-type region and protruding p-type region: 20 to 200 nm
Gate length: 10 to 50 nm
Thickness of gate insulating film: 1 to 5 nm Each component of a semiconductor device of the present invention will be described below in more detail.

(Gate Electrode)

The first and second gate electrodes include silicide regions (1) and (2) in contact with the first and second gate insulating films, respectively. Silicide regions (1) and (2) may form part or all of the respective first and second gate electrodes.

In the present invention, interaction between the silicon in silicide regions (1), (2) and the high-dielectric material in the first and second gate insulating films (Fermi level pinning) controls $V_{th}$ of each MOS transistor. The Fermi level pinning depends on the combination of the gate insulating film and the gate electrode in contact therewith. Therefore, when the crystalline phases of the portions of silicide regions (1) and (2) that are in contact with the first and second gate insulating films satisfy the conditions defined in the present invention, the advantageous effect of the present invention can be obtained irrespective of the constituent elements and crystalline phases in the portions of the gate electrodes that are not in contact with the gate insulating films.

When silicide regions (1) and (2) form part of the first and second gate electrodes, respectively, each of the first and second gate electrodes may be comprised of a plurality of layers. In this case, the first and second gate electrodes preferably comprise low-resistance layers on silicide regions (1) and (2), as the top layers (the uppermost layers in the direction of a normal to the embedded insulating film) of the first and second gate electrodes. Providing the low-resistance layer allows the contact resistance between the gate electrode and wiring to be effectively reduced.

An example of the low-resistance layer may be an NiSi layer. For a semiconductor device including an nMOS transistor and a pMOS transistor, only one of the first and second gate electrodes may include a plurality of layers or a low-resistance layer, and the other gate electrode may be entirely comprised of a silicide region.

Silicide region (1) that forms the first gate electrode comprises at least one type of crystalline phase selected from the group consisting of a $WSi_2$ crystalline phase, an $MoSi_2$ crystalline phase, an NiSi crystalline phase, and an $NiSi_2$ crystalline phase. Any of the crystalline phases can be present as a primary crystalline phase in silicide region (1).

Figure 4:
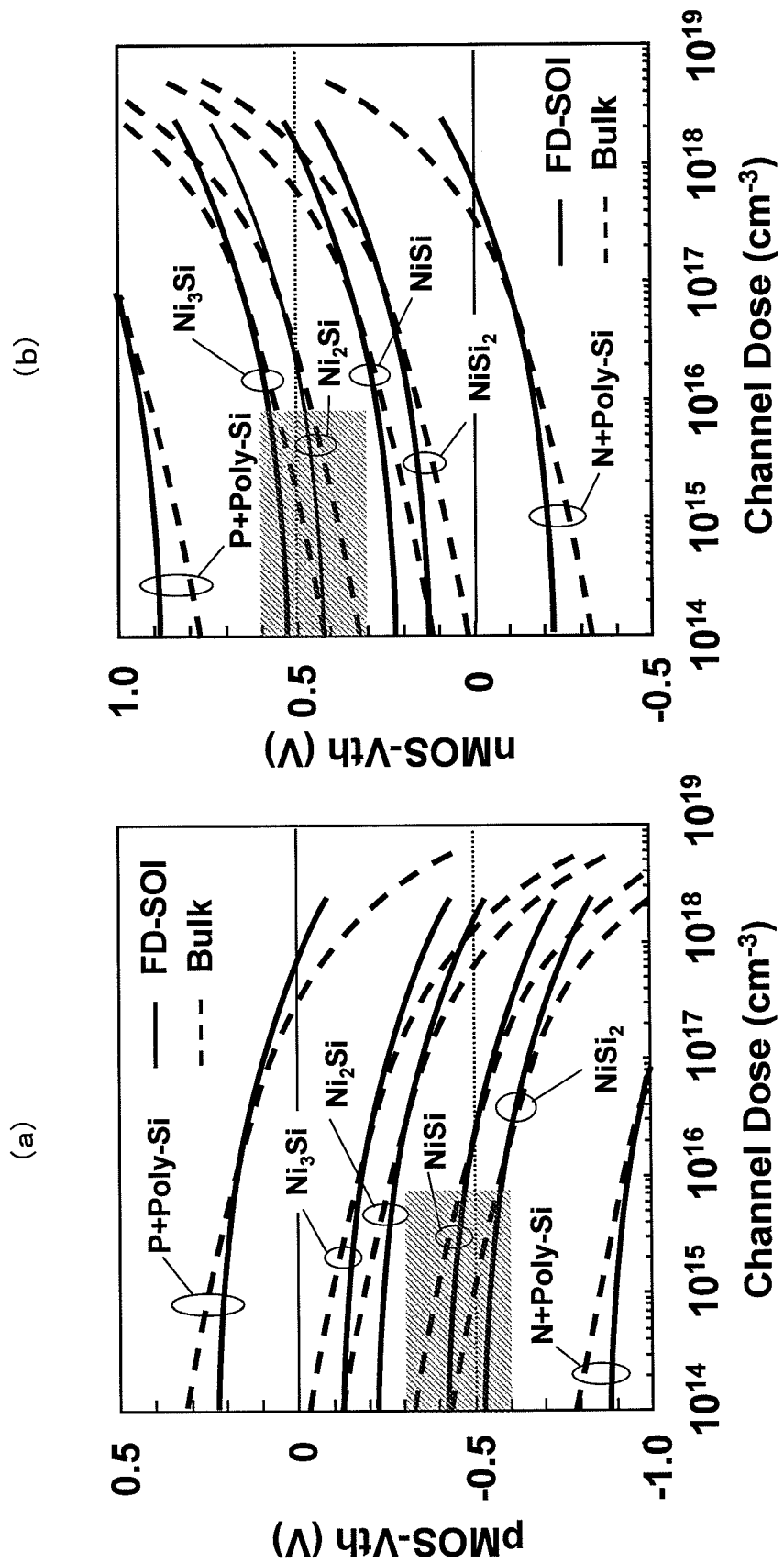
FIG. 4 shows the relationship between the amount of channel dose and a threshold voltage ($V_{th}$) in semiconductor devices of related art and the present invention.

The composition of any of the crystalline phases is readily controlled, and the work function of any of the crystalline phase can be controlled to be a value within the range from approximately 4.2 to 4.5 eV by the interaction with the high-dielectric insulating film (Fermi level pinning). Therefore, $V_{th}$ can be controlled to a value within the range from −0.6 to −0.3 V, whereby a high-speed, low-power pMOS transistor can be achieved. For example, FIG. 4(a) shows that when the gate electrode comprises an NiSi or $NiSi_2$ crystalline phase, $V_{th}$ can be set to a value within the range from −0.6 to −0.3 V in a low-channel-dose area.

To minimize variation in device characteristics, it is desirable that the portion of the gate electrode that is in contact with the gate insulating film comprises a single crystalline phase where possible and has a fixed composition corresponding to the single crystalline phase. Silicide region (1) has in some cases a plurality of mixed phases distributed in the gate electrode in the vicinity of the interface with the gate insulating film depending on the thermal history of silicide region (1) when it is formed. The average composition of the gate electrode may therefore be shifted from the stoichiometric composition of the crystalline phase. Even in such a case, however, $V_{th}$ can be controlled to be a value within the range from −0.6 to −0.3 V by ensuring that the portion of the first gate electrode on the first gate insulating film side has the following composition:

Tungsten silicide: $W_aSi_{2b}$ ($0.85 \leq a, b \leq 1.15$)
Molybdenum silicide: $Mo_cSi_{2d}$ ($0.85 \leq c, d \leq 1.15$)
Nickel silicide: $Ni_eSi_f$ ($0.85 \leq e, f \leq 1.15$), $Ni_gSi_{2h}$ ($0.85 \leq g, h \leq 1.15$)

Second silicide region (2) that forms the second gate electrode comprises at least one type of crystalline phase selected from the group consisting of a PtSi crystalline phase, a $Pt_2Si$ crystalline phase, an IrSi crystalline phase, an $Ni_2Si$ crystalline phase, and an $Ni_3Si$ crystalline phase. Any of the crystalline phases can be present as a primary crystalline phase in silicide region (2).

The composition of any of the crystalline phases is readily controlled, and the work function of any of the crystalline phase can be controlled to be a value within the range from approximately 4.6 to 4.9 eV by the interaction with the high-dielectric insulating film (Fermi level pinning). Therefore, $V_{th}$ can be controlled to a value within the range from 0.3 to 0.6 V, whereby a high-speed, low-power nMOS transistor with excellent device characteristics can be achieved. For example, FIG. 4(b) shows that when the gate electrode comprises an $Ni_2Si$ or $Ni_3Si$ crystalline phase, $V_{th}$ can be set to a value within the range from 0.3 to 0.6 V in a low-channel-dose area.

To minimize variation in device characteristics, it is desirable that the portion of the gate electrode that is in contact with the gate insulating film has a single crystalline phase where possible and has a fixed composition corresponding to the single crystalline phase. Silicide region (2) has in some cases a plurality of mixed phases distributed in the gate electrode in the vicinity of the interface with the gate insulating film depending on the thermal history of silicide region (2) when it is formed. The average composition of the gate electrode may therefore be shifted from the stoichiometric composition of the crystalline phase. Even in such a case, however, $V_{th}$ can be controlled to be a value within the range from 0.3 to 0.6 V by ensuring that the portion of the second gate electrode on the second gate insulating film side has the following composition:

Platinum silicide: $Pt_iSi_j$ ($0.85 \leq i, j \leq 11.15$), $Pt_{2k}Si_l$ ($0.85 \leq k, l \leq 1.15$)
Iridium silicide: $Ir_mSi_n$ ($0.85 \leq m, n \leq 1.15$)
Nickel silicide: $Ni_{2o}Si_p$ ($0.85 \leq o, p \leq 1.15$), $Ni_{3q}Si_r$ ($0.85 \leq q, r \leq 1.15$)

Further, a silicide region comprising a YbSi crystalline phase or an HfSi crystalline phase can be provided in the first gate electrode in such a way that the silicide region is in contact with the first gate insulating film. Since Ta, Co, Ti, V, Cr, Zr, Nb, and other metals comprise a plurality of silicide crystalline phases, silicide regions in the first and second gate electrodes can have any of the metal silicide crystalline phases. However, any of the crystalline phases, when used in a gate electrode, needs to give $V_{th}$ necessary for a low-power MOS transistor.

(N-type Region, P-type Region)

The N-Type Region and the P-Type Region that Form a Semiconductor device of the present invention contain n-type and p-type impurity elements, respectively. To operate a MOS transistor at a higher speed, improve the drive rate, and reduce power consumption, it is necessary to lower the n-type impurity concentration in the n-type region and the p-type impurity concentration in the p-type region. The impurity concentration typically ranges from $1\times10^{14}$ to $1\times10^{17}$ cm$^{-3}$, preferably $1\times10^{14}$ to $1\times10^{16}$ cm$^{-3}$, more preferably $1\times10^{14}$ to $1\times10^{15}$ cm$^{-3}$.

(Source/Drain Region)

An n-type impurity element is implanted into the source/drain region of an nMOS transistor, and a p-type impurity element is implanted into the source/drain region of a pMOS transistor. The p-type impurity element may be B, and the n-type impurity element may be P, As, Sb, or other elements. The impurity element concentration in the source/drain region typically may range from $1\times10^{19}$ to $1\times10^{21}$ cm$^{-3}$.

Further, a silicide layer may be provided on the source/drain region of each MOS transistor. The material of the silicide layer is not particularly limited, but may be Ni silicide, Co silicide, Ti silicide, and other metal silicides. It is preferable to use a silicide material that is not altered during formation of the gate electrode (annealing for silicidation) but is stable at high temperatures.

(Gate Insulating Film)

The gate insulating film needs to include at least one high-dielectric insulating film layer. "High-dielectric insulating film" used herein refers to a film having a dielectric constant higher than that of a gate insulating film made of $SiO_2$ used as a conventional gate insulating film, but the dielectric constant of the high-dielectric insulating film is not particularly limited.

The high-dielectric insulating film is preferably an insulating film made of a metal oxide, a metal silicate, or a metal-oxide- or metal-silicate-based material to which nitrogen is introduced. Since any of the above insulating films can be uniformly formed even when it is formed into a thin film, Fermi level pinning can therefore occur effectually and effectively. The high-dielectric insulating film preferably contains Hf or Zr.

Another typical example of the high-dielectric insulating film may be HfSiON. Still another example of the high-dielectric insulating film may be made of at least one of the materials selected from the group consisting of Hafnia (HfO$_2$), zirconia (ZrO$_2$), hafnium silicate (HfSiO$_x$), zirconium silicate (ZrSiO$_x$), hafnium aluminate (HfAlO$_x$), and zirconium aluminate (ZrAlO$_x$).

More specifically, the high-dielectric insulating film may be made of at least one of the materials selected from the group consisting of hafnium oxide, hafnium silicon oxide, zirconium oxide, zirconium silicon oxide, hafnium oxynitride, hafnium silicon oxynitride, zirconium oxynitride, zirconium silicon oxynitride, aluminum oxide, hafnium aluminum oxide, lanthanum oxide, hafnium lanthanum oxide, zirconium aluminum oxide, aluminum oxynitride, hafnium aluminum oxynitride, lanthanum oxynitride, hafnium lanthanum oxynitride, and zirconium aluminum oxynitride.

The gate insulating film may have any form as long as it includes at least one high-dielectric insulating film layer, and may be comprised of a single layer or a plurality of layers. When the gate insulating film is comprised of a plurality of layers, the high-dielectric insulating film is preferably provided on the gate electrode side, that is, the high-dielectric insulating film is preferably in contact with the gate electrode. Providing the high-dielectric insulating film on the gate electrode side allows Fermi level pinning to occur effectively.

The thickness of the high-dielectric insulating film preferably ranges from 1 to 10 nm, more preferably from 1 to 3 nm. The high-dielectric insulating film can be formed by using ALD (Atomic Layer Deposition) and MOCVD (Metal Organic Chemical Vapor Deposition).

(Method for Manufacturing Semiconductor Device)

First Exemplary Embodiment

FIGS. 7 to 9 show an example of a method for manufacturing a semiconductor device of the present invention. FIGS. 7 to 9 show a method for manufacturing a semiconductor device including a planar pMOS transistor.

First, a substrate including support substrate 1, embedded insulating film 11, and silicon layer 42 with an n-type region is prepared. The thickness of silicon layer 42 in the substrate is adjusted in such a way that a manufactured pMOS transistor is fully depleted. The substrate can be formed by using bonding or SIMOX. For example, a smart-cut method or an ELTRAN method may be used.

STI (Shallow Trench Isolation) technique is then used to form isolation region 2 in silicon layer 42 so that n-type region 24 is isolated. Thermal oxidation is then used to form insulating film 19 comprised of a silicon oxide film on the surface of silicon layer 42.

High-dielectric insulating film 18 is subsequently formed on insulating film 19. To form an HfSiON film as high-dielectric insulating film 18, for example, part of insulating film 19 is converted into an HfSiO film by using long throw sputtering to deposit an Hf film on insulating film 19 and performing two-stage heat treatment in an oxygen atmosphere and a nitrogen atmosphere. Nitriding annealing in an NH$_3$ atmosphere is then carried out to form an HfSiON film.

On the other hand, to form a hafnium oxide film as high-dielectric insulating film 18, for example, a hafnium nitride film is formed by CVD using HfCl$_4$ and NH$_3$, CVD using an organic Hf gas, or sputtering using a hafnium nitride target or a hafnium target. The hafnium nitride film is then oxidized to form a hafnium oxide film.

The high-dielectric insulating film is not limited to a HfSiON film and a hafnium oxide film, but may be any of a silicon oxide film, a silicon nitride film, a metal-oxide- or metal-silicate-based high-dielectric insulating film, and a metal-oxide- or metal-silicate-based high-dielectric insulating film to which nitrogen is introduced.

Poly-Si film (polysilicon film) 43 and mask layer 15 comprised of a silicon oxide film are then deposited on high-dielectric insulating film 18 by using CVD (Chemical Vapor Deposition) (FIG. 7(a)).

Patterning is then carried out by using lithography technique and reactive ion etching (RIE) technique. The patterning forms a region comprised of a first gate insulating film, first gate electrode material 14b, and mask (A) 15 on n-type region 24 (FIG. 7(b)).

After a silicon oxide film is further deposited, the structure is etched back to form gate sidewall 7 on the sides of first gate electrode material 14b and mask (A) 15. Mask (A) 15 and gate sidewall 7 are used as a mask to implant a p-type impurity into n-type region 24, and heat treatment is carried out to activate the p-type impurity. P-type source/drain region 30b is thus provided (FIG. 7(c)).

Further, sputtering is used to deposit metal film 16 over the surface, and mask (A) 15, gate sidewall 7, and STI 2 are used as a mask in conjunction with salicide technique to form silicide layer 6 only on source/drain region 30b (FIG. 7(d)). Silicide layer 6 may be made of Ni mono-silicide (NiSi), by which contact resistance can be minimized. Silicide layer 6 may be made of any other heat-resistant silicide that is not altered by heat when the first gate electrode material undergoes silicidation. For example, Ni silicide may be replaced with Co silicide or Ti silicide.

After unnecessary metal film 16 is removed (FIG. 8(a)), CVD (Chemical Vapor Deposition) is used to form interlayer insulating film 10 comprised of a silicon oxide film over the surface (FIG. 8(b)). CMP technique is then used to planarize interlayer insulating film 10 to expose mask (A) 15. The structure is then etched back to expose first gate electrode material 14b (FIG. 8(c)).

DC magnetron sputtering is used to deposit Ni film 51 over the surface (FIG. 9(a)). Heat treatment is carried out to cause the Ni to react with first gate electrode material 14b so that first gate electrode material 14b is converted into silicide (first silicidation) comprising an NiSi or $NiSi_2$ crystalline phase (FIG. 9(b)).

In this process, the heat treatment needs to be carried out at a temperature at which a diffusion rate high enough to convert all first gate electrode material 14b into silicide is achieved. When silicide layer 6 has been formed on source/drain region 30b, the heat treatment needs to be carried out at a temperature at which the silicide layer will not be altered by heat into a material of higher resistance.

In the first silicidation step described above, the following factors affect which crystalline phase the resultant Ni silicide has, among an NiSi crystalline phase or an $NiSi_2$ crystalline phase: (1) the ratio of the film thickness (the thickness in the direction of a normal to the embedded insulating film) $T_{Ni}$ of the Ni layer deposited on the first gate electrode material to the film thickness $T_{Si}$ of the first gate electrode material, $T_{Ni}/T_{Si}$, and (2) the annealing temperature during the silicidation.

Figure 27:
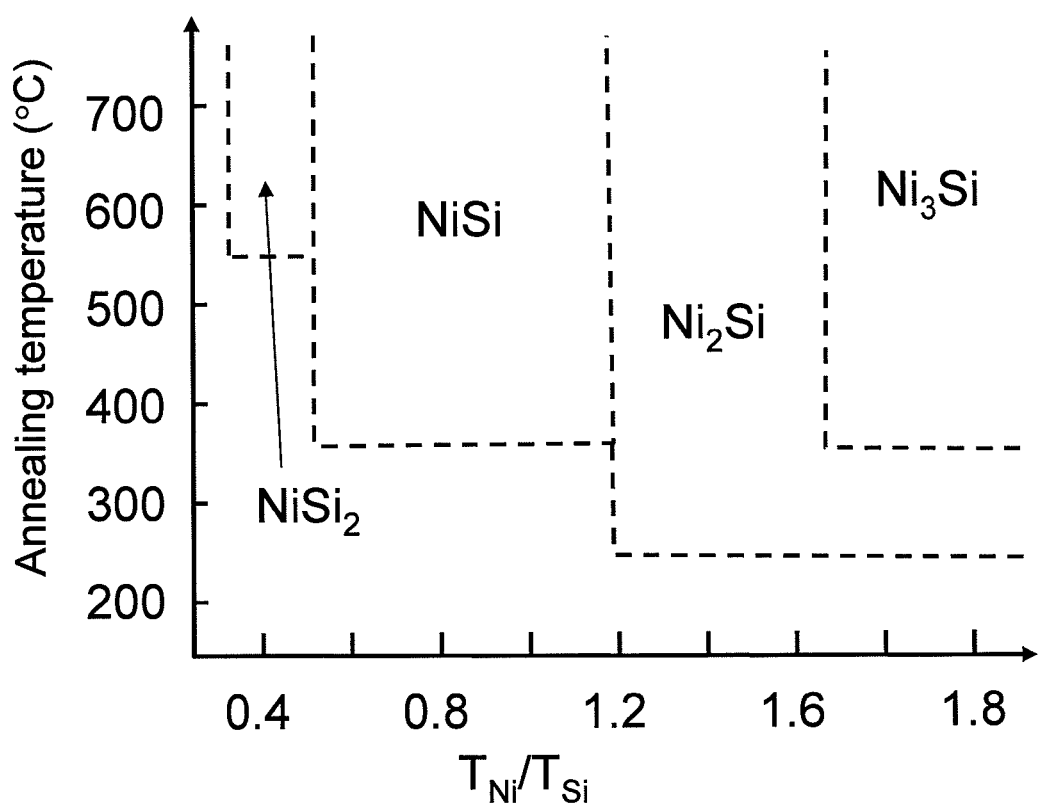
FIG. 27 shows the relationship between silicidation conditions and the crystalline phase of nickel silicide in the vicinity of the interface between a gate electrode and a gate insulating film.

Specifically, FIG. 27 shows the relationship between (1), (2) described above and the composition of the crystalline phase of the Ni silicide in the vicinity of the interface between the gate electrode and the gate insulating film. Adjusting the silicidation conditions in consideration of the relationship of $T_{Ni}/T_{Si}$ and the annealing temperature with the Ni silicide composition shown in FIG. 27 allows Ni silicide having a composition that corresponds to a desired crystalline phase to be achieved in the vicinity of the interface between the gate electrode and the gate insulating film. The heat treatment needs to be carried out in a non-oxidation atmosphere in order to prevent oxidation of the metal film.

Typical conditions for obtaining an NiSi crystalline phase may be, for example, $0.55 \leq T_{Ni}/T_{Si} \leq 0.95$.

Typical conditions for obtaining an $NiSi_2$ crystalline phase may be, for example, the temperature during silicidation (annealing temperature) being 650° C. or higher and $0.28 \leq T_{Ni}/T_{Si} \leq 0.54$.

The excess Ni film that has not been converted into silicide in the heat treatment described above is removed in a wet etching process using sulfuric acid in a hydrogen peroxide solution (FIG. 9(c)).

A semiconductor device including a planar nMOS transistor can also basically be manufactured by using the same manufacturing method described above. Silicide region (2), however, comprises a crystalline phase of metal silicide having a composition different from that of silicide region (1) or a different type of metal silicide different from that of silicide region (1). Therefore, depending on the type of the crystalline phase of the metal silicide that forms silicide region (2), the type of metal to be deposited on second gate electrode material 14a (corresponding to the step in FIG. 9(a)) and the annealing conditions during the silicidation (third silicidation corresponding to the step in FIG. 9(b)) differ from those in the manufacturing method described above.

For example, when silicide region (2) comprises an $Ni_2Si$ or $Ni_3Si$ crystalline phase, $T_{Ni}/T_{Si}$ and the annealing temperature are set in accordance with FIG. 27 so that these corresponding crystalline phases are obtained.

More specifically, typical conditions for obtaining an $Ni_2Si$ crystalline phase may be, for example, the temperature during silicidation ranging from 250 to 350° C. and $T_{Ni}/T_{Si}$ ranging from 1.2 to 1.6. Typical conditions for obtaining an $Ni_3Si$ crystalline phase may be, for example, $1.7 \leq T_{Ni}/T_{Si}$.

While the above description of the method for manufacturing an nMOS transistor is made with reference to the method for manufacturing Ni silicide, the same method described above can be used to manufacture an nMOS transistor in which silicide region (2) comprises an IrSi crystalline phase, a PtSi crystalline phase, or a $Pt_2Si$ crystalline phase. In this case, however, in the step of depositing the metal film (third silicidation corresponding to the step in FIG. 9(a)), an Ir film or a Pt film is deposited instead of the Ni film. Further, in the silicidation (corresponding to the step in FIG. 9(b)), a preferable annealing condition is set so that an IrSi crystalline phase, a PtSi crystalline phase, or a $Pt_2Si$ crystalline phase is formed. The Pt layer or any other layer that has not reacted in the silicidation and has been left is then removed in a wet etching process using diluted aqua regia (corresponding to the step in FIG. 9(c)).

Typical conditions for forming an IrSi crystalline phase in silicide region (2) may be, for example, the silicidation temperature ranging from 400 to 600° C. and $T_{Ir}/T_{Si}$ ranging from 0.8 to 1.2.

Typical conditions for forming a $Pt_2Si$ crystalline phase may be, for example, the silicidation temperature ranging from 200 to 500° C. and $T_{Pt}/T_{Si}$ ranging from 1.55 to 1.8.

Typical conditions for forming a PtSi crystalline phase may be, for example, the silicidation temperature ranging from 300 to 500° C. and $T_{Pt}/T_{Si}$ ranging from 0.75 to 0.9.

In the manufacturing method of the present exemplary embodiment, a uniform crystalline phase having a specific composition can thus be automatically obtained. Further, the process conditions, such as the silicidation temperature and the film thickness of the metal layer, for obtaining a crystalline phase having a specific composition has a wide margin, whereby a variety of manufacturing conditions can be selected.

Second Exemplary Embodiment

FIGS. 10 to 14 show another example of the method for manufacturing a semiconductor device of the present invention. FIGS. 10 to 14 show a method for manufacturing a semiconductor device including planar pMOS and nMOS transistors.

First, a substrate including support substrate 1, embedded insulating film 11, and silicon layer 42 with n-type and p-type regions is prepared. The thickness of silicon layer 42 in the substrate is adjusted in such a way that each of manufactured MOS transistors is fully depleted.

Isolation region 2 is then formed so that n-type region 24 is isolated from p-type region 23, as in the first exemplary embodiment. Silicon oxide film 19, high-dielectric insulating film 18, poly-Si film (polysilicon film) 43, and mask layer 15 are sequentially formed on the surface of silicon layer 42 (FIG. 10(a)).

Patterning is then carried out to form a region comprised of a first gate insulating film, first gate electrode material 14b, and mask (D) 15b on n-type region 24, and a region comprised of a second gate insulating film, second gate electrode material 14a, and mask (E) 15a on p-type region 23 (FIG. 10(b)).

Further, gate sidewalls 7 are formed on both sides of first gate electrode material 14b and mask (D) 15b and on both sides of second gate electrode material 14a and mask (E) 15a. After this, after mask (F) (not shown) is formed on p-type region 23, masks (D), (F) and gate sidewalls 7 are used as a mask to implant a p-type impurity into the n-type region, and heat treatment is carried out to activate the p-type impurity. Source/drain region 30b is thus formed. After mask (F) is removed and mask (G) (not shown) is formed on n-type region 24, masks (E), (G) and gate sidewalls 7 are used as a mask to implant an n-type impurity into the p-type region, and heat treatment is carried out to activate the n-type impurity. Source/drain region 30a is thus formed. Mask (G) is then removed (FIG. 10(c)).

Metal layer 16 is then deposited all over the resulting surface (FIG. 11(a)), and salicide technique is used to form silicide layers 6 on source/drain regions 30a and 30b (FIG. 11(b)). After interlayer insulating film 10 is deposited all over the resulting surface, the resulting structure is planarized and etched back, so that first and second gate electrode materials 14b, 14a are exposed (FIG. 11(c)).

After DC magnetron sputtering is used to deposit Ni layer 51 all over the resulting surface, CVD is used to deposit diffusion blocking layer 37 all over the resulting surface. Diffusion blocking layer 37 refers to a layer made of a material that prevents the Ni from diffusing during silicidation. A preferred example of such a material is TiN.

Diffusion blocking layer 37 only on p-type region 23 is then removed, and Ni layer 51 is further deposited (FIG. 12(a)). Heat treatment is then carried out to cause first and second gate electrode materials 14b, 14a to react with the Ni so that a silicidation occurs (fourth silicidation step, FIG. 12(b)). In this process, since diffusion blocking layer 37 is left only above n-type region 24, Ni layer 51 deposited on diffusion blocking layer 37 will not be involved in the silicidation reaction during the silicidation. Film thickness $W_2$ of Ni layer 51 deposited on first gate electrode material 14b is therefore smaller than film thickness $W_1$ of Ni layer 51 deposited on second gate electrode material 14a. As a result, $T_{Ni}/T_{Si}$ values of both gate electrode materials differ from each other. Therefore, even when annealing treatment during the silicidation of both gate electrode materials is simultaneously carried out at the same temperature, the compositions of the first and second gate electrode materials can be different from each other by selecting an appropriate temperature so that the first gate electrode material comprising an NiSi or $NiSi_2$ crystalline phase and the second gate electrode material comprising an $Ni_2Si$ or $Ni_3Si$ crystalline phase.

Another method can be used to allow the first and second gate electrode materials to have different compositions.

For example, after the same steps as those in the above exemplary embodiment are carried out for the steps that correspond to FIG. 11(c) and the earlier figures, mask layer 38 is formed on p-type region 23, and Ni layer 51 is deposited all over the resulting surface (FIG. 13(a)). First gate electrode material 14b is then caused to react with the Ni to be converted into an NiSi or $NiSi_2$ crystalline phase. After mask layer 38 and remaining Ni layer 51 are removed (FIG. 13(b)), mask layer 38 is formed on n-type region 24, and Ni layer 51 is deposited all over the resulting surface (FIG. 13(c)). Second gate electrode material 14a is then caused to react with the Ni to be converted into an $Ni_2Si$ or $Ni_3Si$ crystalline phase (FIG. 13(d)).

Figure 13:
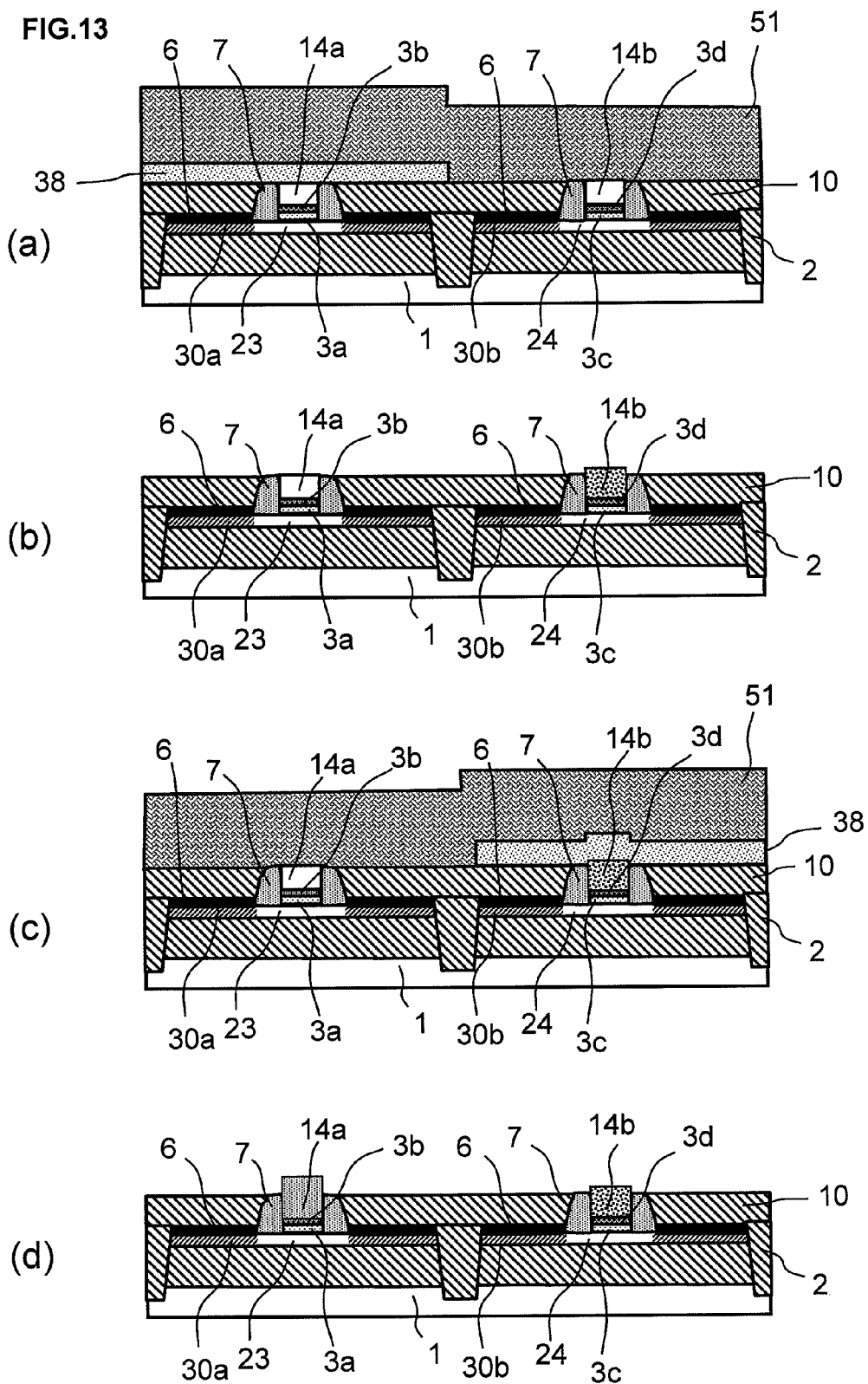
FIG. 13 shows an example of a method for manufacturing a semiconductor device of the present invention.
Figure 14:
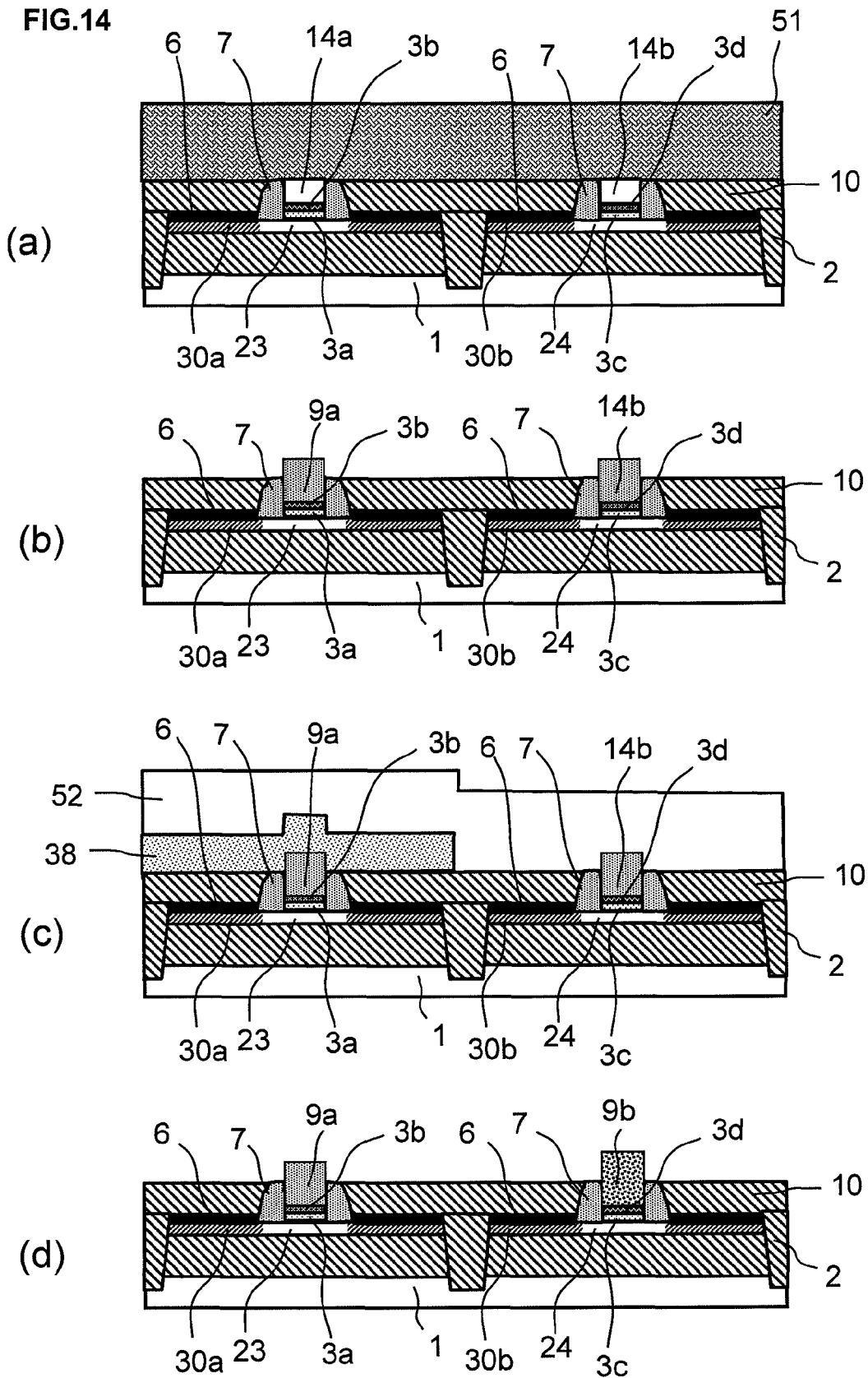
FIG. 14 shows an example of a method for manufacturing a semiconductor device of the present invention.

The first gate electrode (silicide region (1)) and the second gate electrode (silicide region (2)) may thus be formed at different temperature and $T_{Ni}/T_{Si}$ conditions. It is noted that the manufacturing method shown in FIG. 13 is not limited to the formation of Ni silicide, but may be used in a case where silicide region (2) comprises a PtSi crystalline phase, a $Pt_2Si$ crystalline phase, or an IrSi crystalline phase.

In still another method, one of the first and second gate electrodes can be formed in a one-stage silicidation step, and the other can be formed in a two-stage silicidation step. In this manufacturing method, after the same steps as those in the above exemplary embodiment are carried out for the steps that correspond to FIG. 11(c) and the earlier figures, Ni layer 51 is deposited all over the resulting surface (FIG. 14(a)). Silicidation is then carried out to convert first and second gate electrode materials 14b, 14a into an $Ni_2Si$ crystalline phase (FIG. 14(b)). Further, after mask layer 38 is formed on p-type region 23, Si layer 52 is deposited all over the resulting surface (FIG. 14(c)). First gate electrode material 14b comprising an $Ni_2Si$ crystalline phase is then caused to react with the Si to form an NiSi or $NiSi_2$ crystalline phase. The Si layer that has not reacted is removed (FIG. 14(d)).

Figure 15:
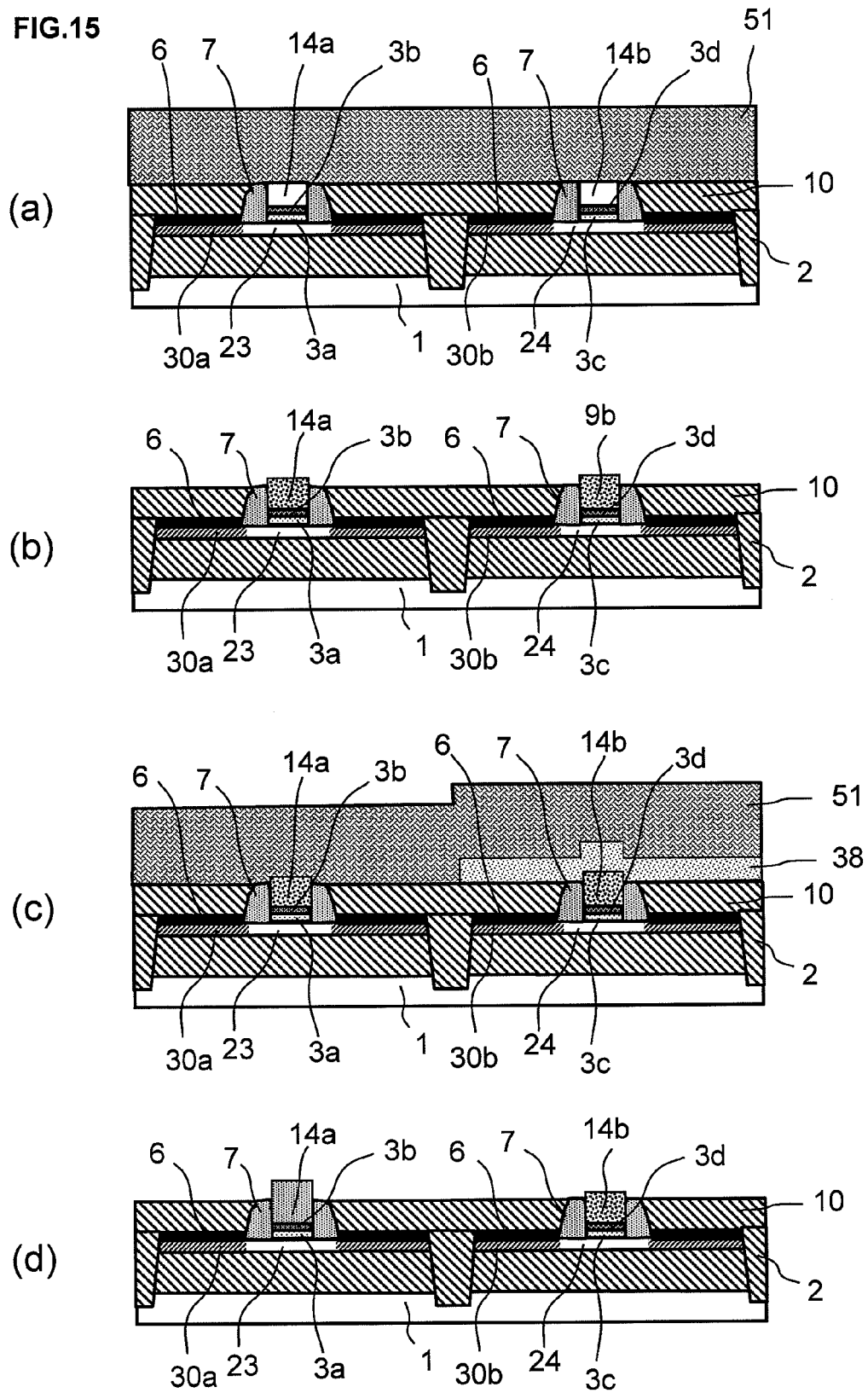
FIG. 15 shows an example of a method for manufacturing a semiconductor device of the present invention.

In still another method, after the same steps as those in the above exemplary embodiment are carried out for the steps that correspond to FIG. 11(c) and the earlier figures, Ni layer 51 is deposited all over the resulting surface (FIG. 15(a)). Silicidation is then carried out to convert first and second gate electrode materials 14b, 14a into an NiSi or $NiSi_2$ crystalline phase (FIG. 15(b)). Further, after mask layer 38 is formed on n-type region 24, Ni layer 51 is deposited all over the resulting surface (FIG. 15(c)). The second gate electrode material comprising an NiSi or $NiSi_2$ crystalline phase is then caused to react with the Ni to form an $Ni_2Si$ or $Ni_3Si$ crystalline phase. The Ni layer that has not reacted is removed (FIG. 15(d)).

Third Exemplary Embodiment

Figure 16:
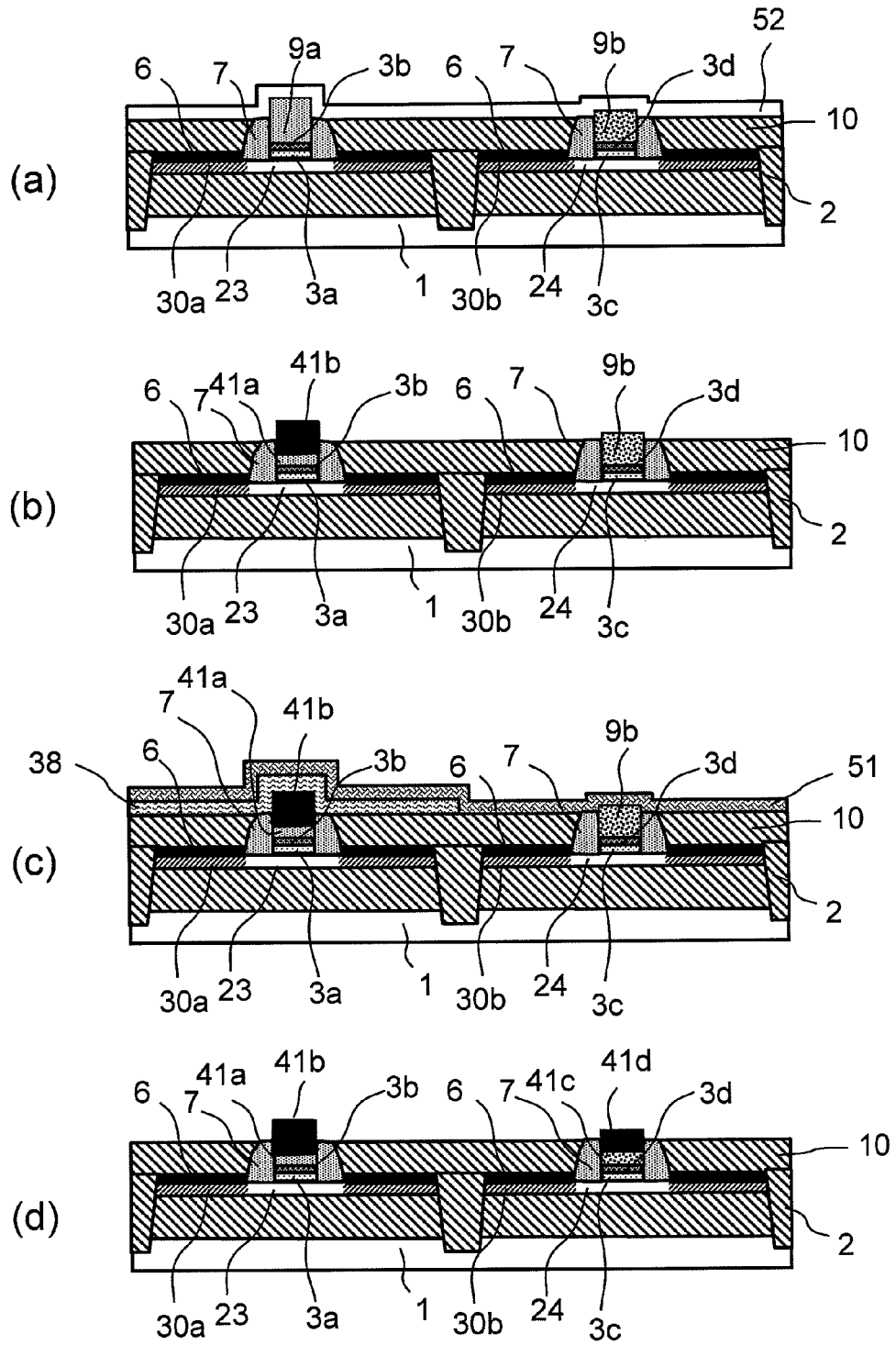
FIG. 16 shows an example of a method for manufacturing a semiconductor device of the present invention.

FIG. 16 shows a variation of the first exemplary embodiment. The present exemplary embodiment differs from the first exemplary embodiment in that the present exemplary embodiment relates to a method for manufacturing a semiconductor device in which each of the first and second gate electrodes is comprised of two layers and the top layer is a low-resistance layer. First, after the same steps as those in the first exemplary embodiment are carried out for the steps that correspond to FIG. 12(b) and the earlier figures, sputtering is used to deposit Si layer 52 all over the resulting surface (FIG. 16(a)). Heat treatment is then carried out to cause the $Ni_2Si$ or $Ni_3Si$ crystalline phase that forms the second gate electrode (silicide region (2)) to react with the Si. In this process, Si is thermally diffused only into the upper portion of the second gate electrode by adjusting the period of the heat treatment, and only the upper portion of the second gate electrode becomes low-resistance layer 41b comprising an NiSi crystalline phase (fifth or sixth silicidation step, FIG. 16(b)). On the other hand, the first gate electrode, when comprising an NiSi or $NiSi_2$ crystalline phase, is stable against the heat treatment and does not react with Si. The composition of the first gate electrode therefore does not change during the heat treatment.

When the first gate electrode comprises an NiSi crystalline phase, the manufacturing step is terminated at this point. On the other hand, when the first gate electrode comprises an NiSi$_2$ crystalline phase, mask layer 38 (mask (H)) is formed on p-type region 23, and sputtering is used to deposit Ni layer 51 all over the resulting surface (FIG. 16(c)). Heat treatment is then carried out by adjusting the period thereof to convert only the upper portion of the first gate electrode into low-resistance layer 41d comprising an NiSi crystalline phase (seventh silicidation step, FIG. 16(d)).

Fourth Exemplary Embodiment

Figure 17:
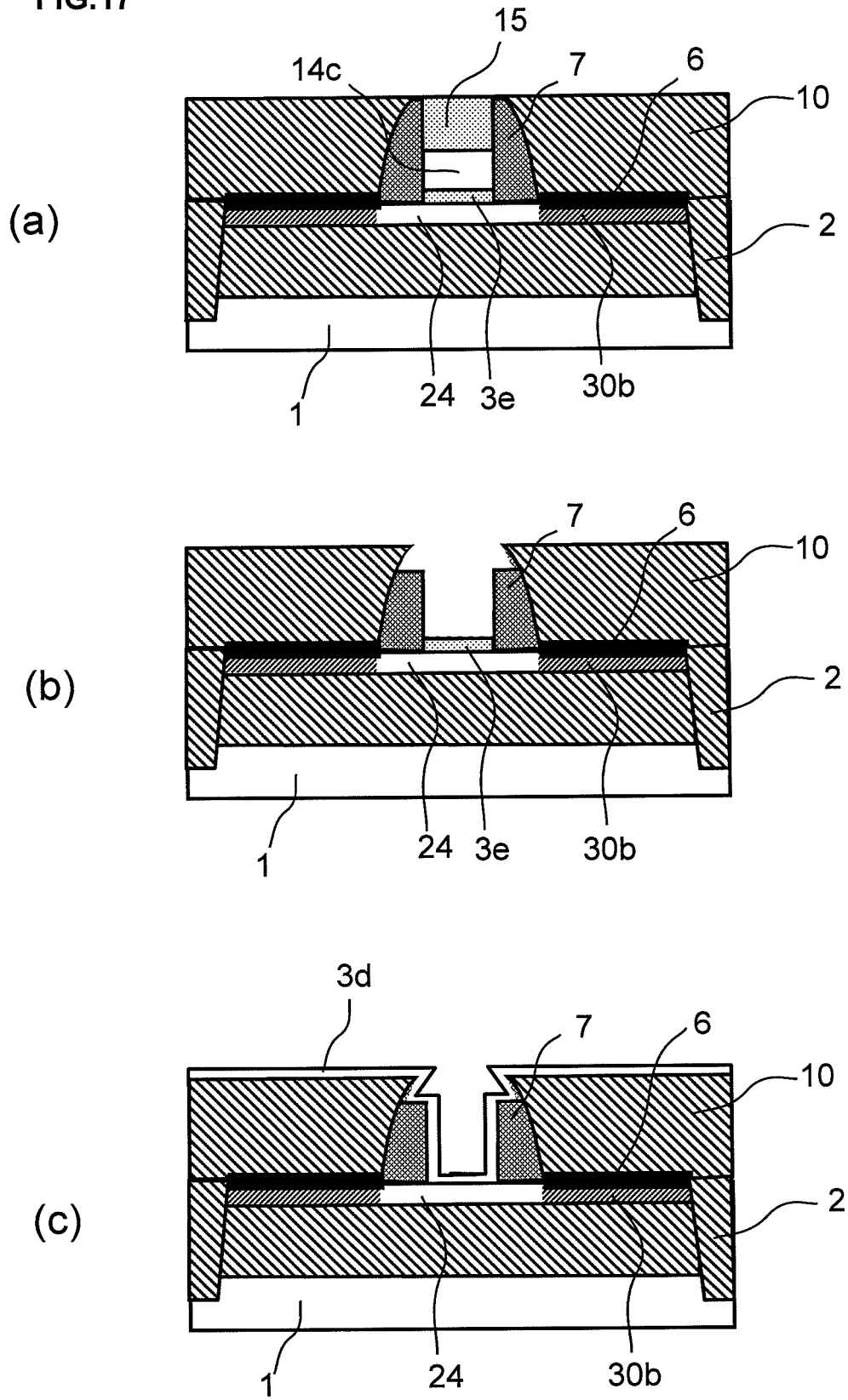
FIG. 17 shows an example of a method for manufacturing a semiconductor device of the present invention.
Figure 20:
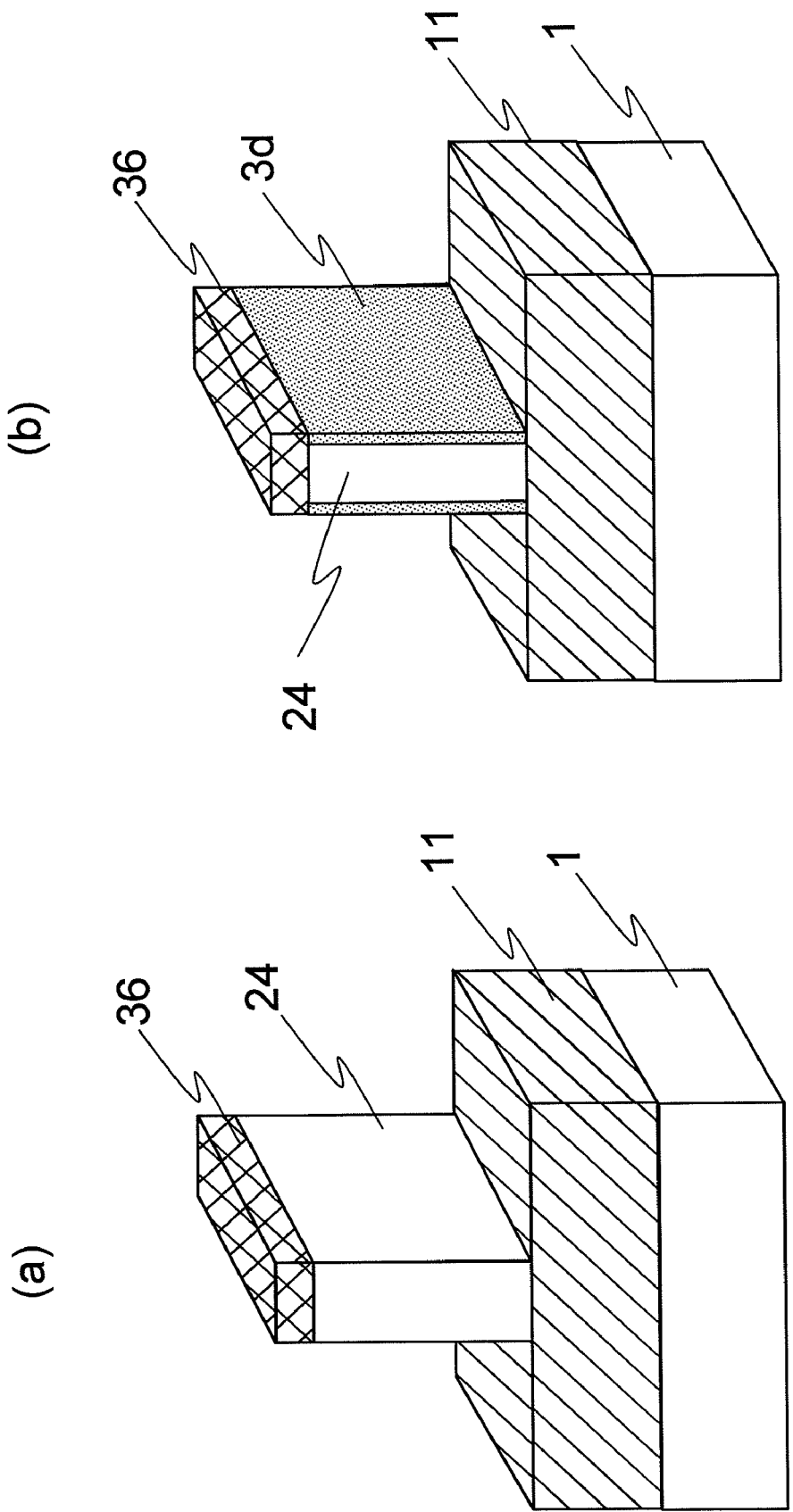
FIG. 20 shows an example of a method for manufacturing a semiconductor device of the present invention.
Figure 22:
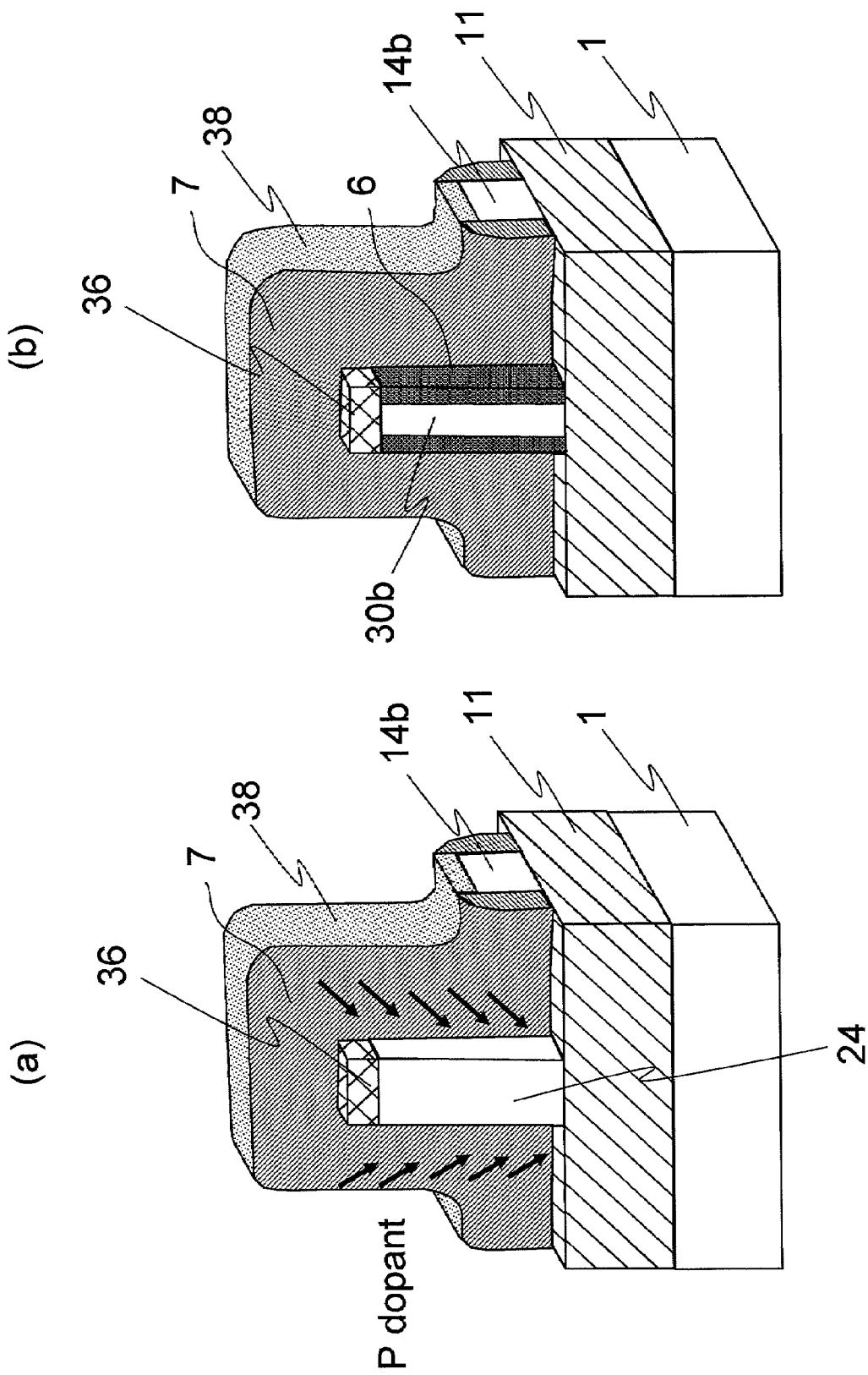
FIG. 22 shows an example of a method for manufacturing a semiconductor device of the present invention.
Figure 23:
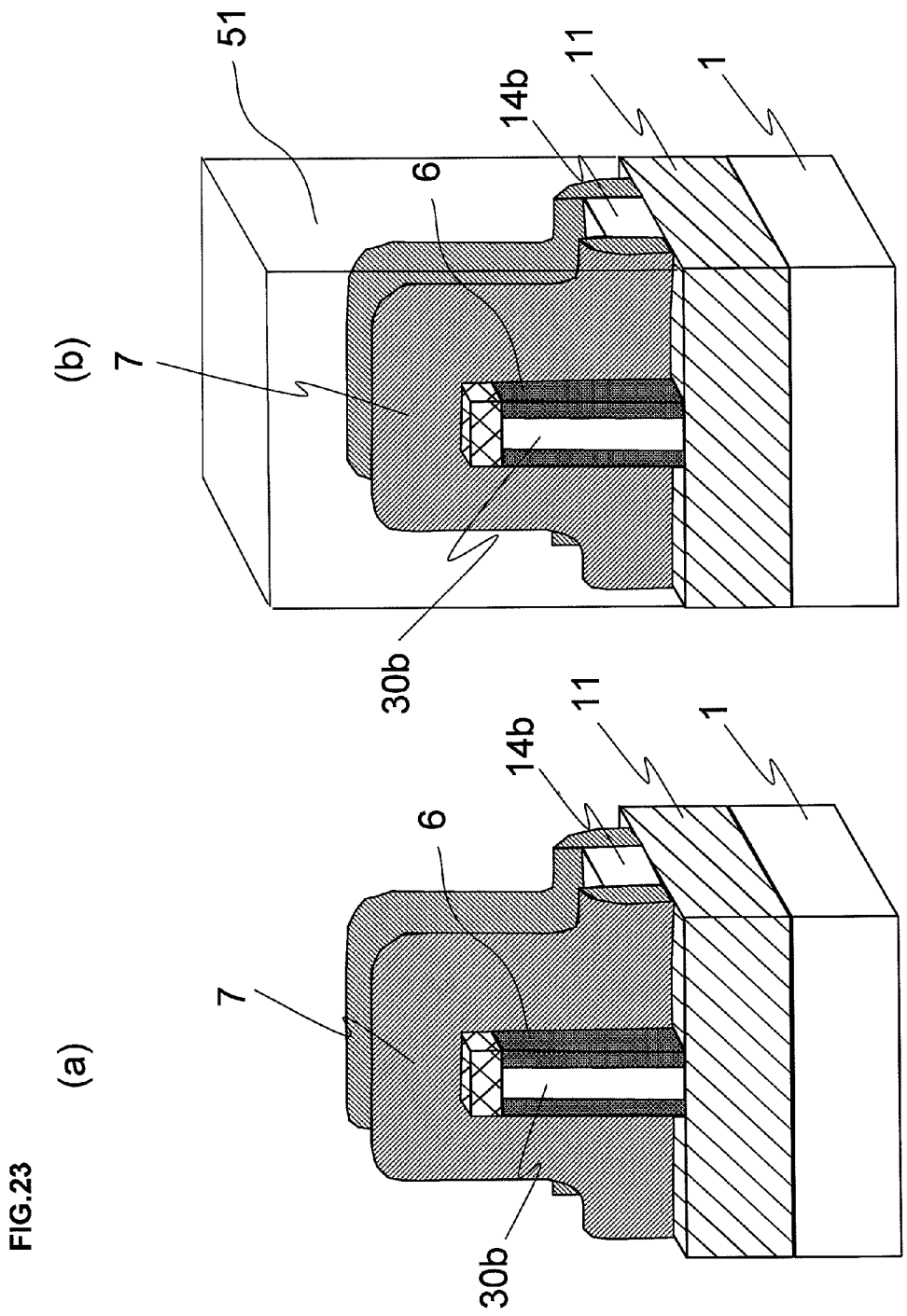
FIG. 23 shows an example of a method for manufacturing a semiconductor device of the present invention.
Figure 24:
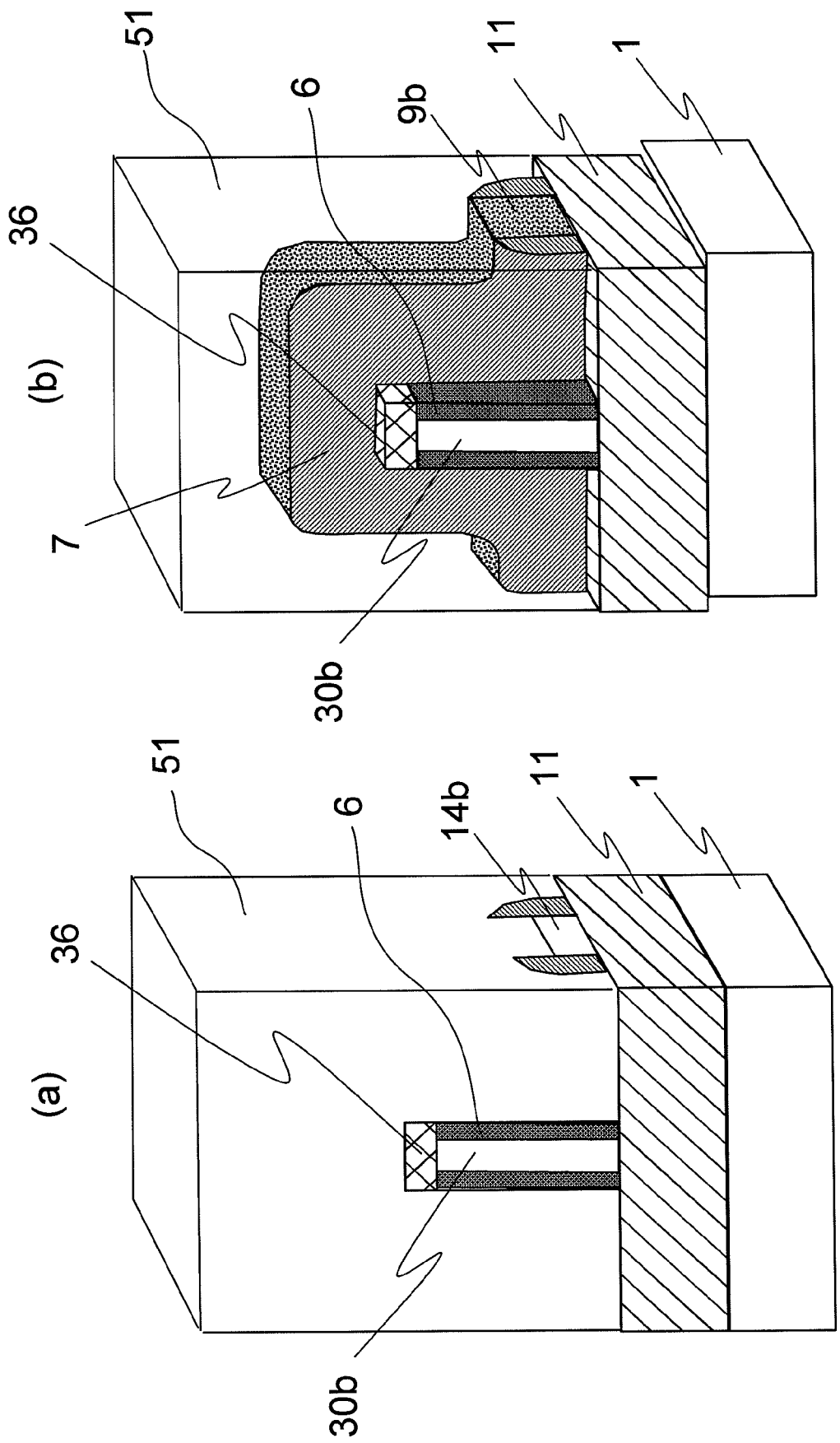
FIG. 24 shows an example of a method for manufacturing a semiconductor device of the present invention.

FIGS. 17 and 18 show another example of the method for manufacturing a semiconductor device of the present invention. FIGS. 17 and 18 show a method for manufacturing a semiconductor device including a planar pMOS transistor in which the first gate electrode comprises a WSi$_2$ or MoSi$_2$ crystalline phase.

The method for manufacturing a semiconductor device is characterized in that a dummy gate insulating film and a dummy gate electrode are used to manufacture a semiconductor device. After the same steps as those in the first exemplary embodiment described above are carried out for the steps that correspond to FIG. 8(b) and the earlier figures, CMP is used to carry out planarization to expose mask layer 15 (mask (B)) formed on dummy gate electrode material 14c (FIG. 17(a)). While an SiO$_2$ film and a high-dielectric insulating film are formed as the gate insulating film in FIG. 8(b), an SiO$_2$ film may be formed as dummy gate insulating film 3e in the present exemplary embodiment.

After phosphoric acid or any other similar acid is used to remove mask layer 15, radical atom etching technique is used to selectively remove dummy gate electrode 14c with respect to interlayer insulating film 10 and gate sidewall 7 (FIG. 17(b)). In this process, a dry etching process or a wet etching process may be used as long as the process can etch Si with a sufficient selection ratio with respect to the gate sidewall and the interlayer insulating film. A wet etching process using fluorinated acid or any other similar acid is used to remove dummy gate oxide film 3e, so that the semiconductor layer composing n-type region 24, is exposed. Subsequently, high-dielectric gate insulating film 3d is formed at least on n-type region 24. As a method for forming the gate insulating film, the same method as that used in the first exemplary embodiment can be used (FIG. 17(c)).

Sputtering, CVD, or any other deposition method is then used to sequentially deposit tungsten film (W film) 53 and silicon film 52 all over the resulting surface (FIGS. 18(a), (b)). In this process, the film thickness of silicon film 52 is set to a value larger than the film thickness of tungsten film 53 so that a WSi$_2$ crystalline phase is formed during silicidation.

Heat treatment is then carried out in a nitrogen gas atmosphere to cause the tungsten to react with the silicon, so that silicidation proceeds and tungsten silicide film (WSi$_2$ crystalline film) 54 is formed (second silicidation step, FIG. 18(c)).

The heat treatment temperature in the second silicidation step preferably ranges from 500 to 600° C. A pMOS transistor including a first gate electrode (silicide region (1)) comprising an MoSi$_2$ crystalline phase can also be basically manufactured by using the same method as that described above. The method, however, differs from the method described above in that in the step of depositing the metal layer (corresponding to the step in FIG. 18(a)), the deposited metal forms an Mo film instead of the W film, and that the temperature in the second silicidation step (corresponding to the step in FIG. 18(c)) and the ratio in thickness of the deposited Mo film to the silicon film (corresponding to the step in FIG. 18(b)) are different. The heat treatment temperature during the formation of the Mo silicide preferably ranges from 500 to 700° C.

The manufacturing method of the present exemplary embodiment can also be used to manufacture a semiconductor device including pMOS and nMOS transistors. In this case, the first and second gate electrodes are made of silicides using different metals. Therefore, to manufacture such a semiconductor device, as shown in FIGS. 14(b) and 15(b), after a first mask is formed on one of the gate electrode materials and then the other gate electrode is formed, the first mask is removed. A second mask is formed as required on the other gate electrode, and then the one gate electrode is formed. The one and other gate electrodes can thus be fabricated by forming them in separate steps.

Fifth Exemplary Embodiment

FIGS. 19 to 25 show another example of the method for manufacturing a semiconductor device of the present invention. The manufacturing method relates to a method for manufacturing a semiconductor device including a fin-type pMOS transistor.

First, a substrate including silicon substrate 1, embedded insulating film 11, and semiconductor layer 42 with an n-type region sequentially stacked is prepared (FIG. 19(a)).

CVD is then used to provide mask pattern 36 on semiconductor layer 42 (FIG. 19(b)). A silicon nitride film is preferably used as material of mask pattern 36. Mask pattern 36 is used as a mask to etch the resulting structure so as to form protruding n-type region 24 protruding from embedded insulating film 11 (FIG. 20(a)).

High-dielectric insulating films (HfSiO film) 3d are then formed on both sides of protruding n-type region 24 (FIG. 20(b)). After a polysilicon layer is deposited all over the resulting surface, lithography is carried out to form polysilicon layer 43 that covers protruding n-type region 24 from one side thereof through the upper surface to the other side.

Mask 38 comprised of an SiO$_2$ film is formed on polysilicon layer 43 (FIG. 21(a)), and lithography is carried out to form mask 38 that covers the central part of n-type region 24 from one side thereof through the upper surface to the other side. Mask 38 is used as a mask to etch the resulting structure so as to form first gate electrode material 14b that covers the central part of n-type region 24 from one side thereof through the upper surface to the other side. In this step, sides of both parts in n-type region 24 sandwiching first gate electrode material 14b are exposed.

Mask 38 is used as a mask to obliquely implant a p-type impurity into the sides of n-type region 24 so as to form extension regions in n-type region 24 (FIG. 21(b)). Gate sidewalls 7 are then formed on the sides of first gate electrode material 14b and mask 38 (FIG. 22(a)). After a p-type impurity is obliquely implanted into the sides of n-type region 24, heat treatment is carried out to form source/drain region 30b in n-type region 24.

Salicide technique is used to form silicide layers 6 on the sides of source/drain region 30b (FIG. 22(b)). Examples of the silicide layer may include Co silicide and Ni silicide. When Ni silicide is used, a silicide protective layer is preferably provided on the silicide. After mask 38 is removed (FIG.

23(a)), DC sputtering is used to deposit Ni layer 51 all over the resulting surface (FIGS. 23(b), 24(a)).

Figure 25:
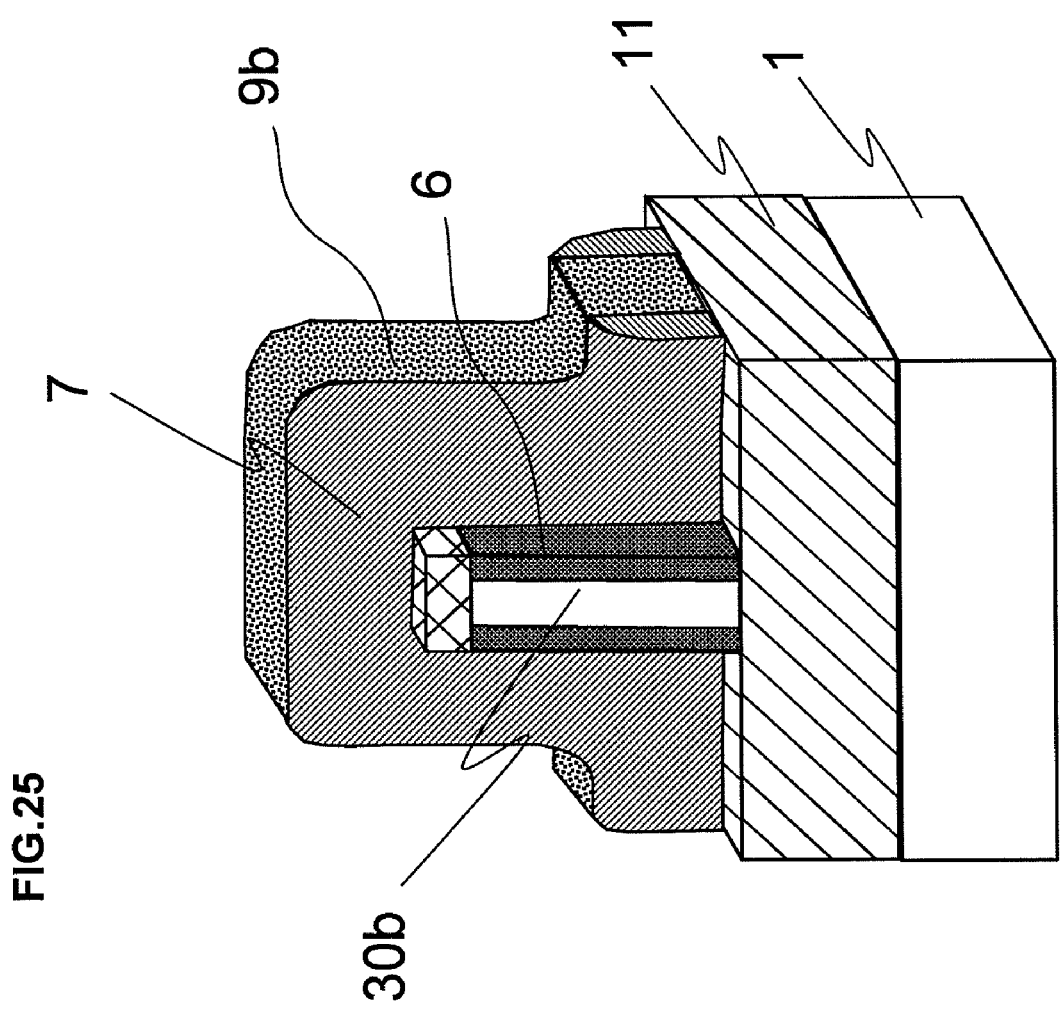
FIG. 25 shows an example of a method for manufacturing a semiconductor device of the present invention.

Heat treatment is then carried out to cause the Ni to react with first gate electrode material 14b, so that first gate electrode material 14b is converted into an NiSi or NiSi$_2$ crystalline phase (FIG. 24(b)). In this process, Ni silicidation is conditioned as shown in FIG. 27 so that an NiSi or NiSi$_2$ crystalline phase is obtained. The excess Ni film that has not been converted into silicide is removed in a wet etching process using sulfuric acid in a hydrogen peroxide solution (FIG. 25).

A semiconductor device including a fin-type nMOS transistor can also be basically manufactured by using the same manufacturing method described above. Silicide region (2), however, comprise a crystalline phase of metal silicide having a composition different from that of silicide region (1) or a type different of metal silicide different from that of silicide region (1). Therefore, depending on the type of the crystalline phase of the metal silicide that forms silicide region (2), the type of metal to be deposited on second gate electrode material 14a (corresponding to the steps in FIGS. 23(b), 24(a)) and the annealing conditions during the silicidation (corresponding to the step in FIG. 24(b)) differ from those in the manufacturing method described above.

The invention claimed is:

1. A semiconductor device, comprising:
   a support substrate;
   an oxide film layer formed on the support substrate; and
   an nMOS transistor and a pMOS transistor formed on the oxide film layer,
   wherein the pMOS transistor is a fully depleted MOS transistor,
   the pMOS transistor comprising:
   an n-type region formed on the oxide film layer;
   a first gate insulating film formed on the n-type region, the first gate insulating film including a high-dielectric insulating film;
   a first gate electrode formed on the first gate insulating film, the first gate electrode including silicide region (1) in contact with the first gate insulating film, the silicide region (1) comprising at least one type of crystalline phase selected from the group consisting of an NiSi crystalline phase and an NiSi$_2$ crystalline phase; and
   a source/drain region formed throughout on both portions in the n-type region sandwiching the first gate electrode in the direction of a normal to the surface where the n-type region is in contact with the first gate insulating film, and
   the nMOS transistor is a fully depleted MOS transistor, the nMOS transistor comprising:
   a p-type region formed on the oxide film layer;
   a second gate insulating film formed on the p-type region, the second gate insulating film including a high-dielectric insulating film;
   a second gate electrode formed on the second gate insulating film, the second gate electrode including silicide region (2) in contact with the second gate insulating film, the silicide region (2) comprising at least one type of crystalline phase selected from the group consisting of an Ni$_2$Si crystalline phase and an Ni$_3$Si crystalline phase; and
   a source/drain region formed throughout on both portions in the p-type region sandwiching the second gate electrode in the direction of a normal to the surface where the p-type region is in contact with the second gate insulating film.

2. The semiconductor device according to claim 1, wherein the pMOS transistor and the nMOS transistor form a CMOS transistor.

3. The semiconductor device according to claim 1, further comprising an isolation region that isolates the n-type region from the p-type region,
   the n-type region, the p-type region, and the isolation region form a single plane on the oxide film layer, and
   the first and second gate electrodes are formed on the plane.

4. The semiconductor device according to claim 3, wherein at least one of the first and second gate electrodes includes a low-resistance layer as the top layer.

5. The semiconductor device according to claim 1, wherein the n-type region and the p-type region are a protruding n-type region and a protruding p-type region separately formed and protruding from the oxide film layer,
   the first gate electrode and the first gate insulating film are formed on both sides of the protruding n-type region, and
   the second gate electrode and the second gate insulating film are formed on both sides of the protruding p-type region.

6. The semiconductor device according to claim 1, wherein the entire first and second electrodes are comprised of silicide regions (1) and (2), respectively.

7. The semiconductor device according to claim 3, wherein the length of the n-type region in the direction of the normal to the surface where the n-type region is in contact with the first gate insulating film and the length of the p-type region in the direction of the normal to the surface where the p-type region is in contact with the second gate insulating film range from 5 to 20 nm.

8. The semiconductor device according to claim 3, wherein the high-dielectric insulating film is a film made of a metal oxide, a metal silicate, or a metal-oxide- or metal-silicate-based material to which nitrogen is introduced.

9. The semiconductor device according to claim 3, wherein the high-dielectric insulating film contains Hf or Zr.

10. The semiconductor device according to claim 3, wherein the high-dielectric insulating film contains HfSiON.

11. A method for manufacturing a semiconductor device according to claim 3 in which the first gate electrode includes the silicide region (1) comprising the NiSi or the NiSi$_2$ crystalline phase and the second gate electrode includes the silicide region (2) comprising the NI$_2$Si or the Ni$_3$Si crystalline phase, the method comprising:
   preparing a substrate in which the support substrate, the oxide film layer, and a semiconductor layer with the n-type region and the p-type region are sequentially stacked;
   depositing a gate insulating film material including the high-dielectric insulating film layer on the semiconductor layer;
   depositing a polysilicon layer and a mask layer sequentially on the gate insulating film material;
   patterning the gate insulating film material, the polysilicon layer, and the mask layer to form the first gate insulating film, a first gate electrode material, and mask (D) that protrud from the n-type region and the second gate insulating film, a second gate electrode material, and mask (E) that protrud from the p-type region;
   forming gate sidewalls on the sides of the first gate insulating film, the first gate electrode material, and the mask (D) and the sides of the second gate insulating film, the second gate electrode material, and the mask (E);

forming mask (F) over the p-type region;

implanting a p-type impurity into the n-type region by using the masks (D), (F), and the gate sidewalls as a mask and carrying out heat treatment to form the source/drain region;

removing the mask (F);

forming the mask (G) over the n-type region;

implanting an n-type impurity into the p-type region by using the masks (E), (G), and the gate sidewalls as a mask and carrying out heat treatment to form the source/drain region;

removing the mask (G);

depositing an interlayer insulating film all over the semiconductor layer removing part of the interlayer insulating film and the masks (D) and (E) to expose the first and second gate electrode materials;

depositing an Ni layer all over the first and second gate electrode materials, depositing a diffusion blocking layer over the first gate electrode material and further depositing an Ni layer all over the first and second gate electrode materials;

converting the first gate electrode material into the first gate electrode including the silicide region (1) comprising the NiSi or the NiSi$_2$ crystalline phase and converting the second gate electrode material into the second gate electrode including the silicide region (2) comprising the Ni$_2$Si or the Ni$_3$Si crystalline phase, by carrying out heat treatment to react the first and the second gate electrode materials with Ni; and removing the Ni layer being not reacted in converting the first gate electrode material into the first gate electrode and the diffusion blocking layer.

12. The method for manufacturing a semiconductor device according to claim 11, wherein after removing the Ni layer and the diffusion blocking layer, the method further comprising:

depositing an Si layer on the first and second gate electrodes;

converting the upper portion of the silicide region (2) into a low-resistance layer comprising an NiSi crystalline phase by carrying out heat treatment to react Si with the Ni$_2$Si or the Ni$_3$Si crystalline phase in the silicide region (2); and removing the Si layer being not reacted in converting the upper portion of the silicide region (2) into a low-resistance layer.

13. The method for manufacturing a semiconductor device according to claim 11, wherein in converting the first gate electrode material into the first gate electrode, the first gate electrode material is converted into the first gate electrode including the silicide region (1) comprising the NiSi$_2$ crystalline phase, after removing the Ni layer and the diffusion blocking layer, the method further comprising:

depositing an Si layer on the first and second gate electrodes;

converting the upper portion of the silicide region (2) into a low-resistance layer comprising the NiSi crystalline phase by carrying out heat treatment to react Si with the Ni$_2$Si or the Ni$_3$Si crystalline phase in the silicide region (2);

removing the Si layer being not reacted in converting the upper portion of the silicide region (2) into a low-resistance layer;

forming mask (H) on the low-resistance layer;

depositing an Ni layer over the surface;

converting the upper portion of the silicide region (1) into a low-resistance layer comprising an NiSi crystalline phase by carrying out heat treatment to react Ni with the NiSi$_2$ crystalline phase in the silicide region (1); and removing the Ni layer being not reacted in converting the upper portion of the silicide region (1) into a low-resistance layer and the mask (H).

14. The semiconductor device according to claim 1, wherein the length of the n-type region in the direction of the normal to the surface where the n-type region is in contact with the first gate insulating film and the length of the p-type region in the direction of the normal to the surface where the p-type region is in contact with the second gate insulating film range from 5 to 20 nm.

15. The semiconductor device according to claim 4, wherein the length of the n-type region in the direction of the normal to the surface where the n-type region is in contact with the first gate insulating film and the length of the p-type region in the direction of the normal to the surface where the p-type region is in contact with the second gate insulating film range from 5 to 20 nm.

16. The semiconductor device according to claim 1, wherein the high-dielectric insulating film is a film made of a metal oxide, a metal silicate, or a metal-oxide- or metal-silicate-based material to which nitrogen is introduced.

17. The semiconductor device according to claim 4, wherein the high-dielectric insulating film is a film made of a metal oxide, a metal silicate, or a metal-oxide- or metal-silicate-based material to which nitrogen is introduced.

18. The semiconductor device according to claim 1, wherein the high-dielectric insulating film contains Hf or Zr.

19. The semiconductor device according to claim 4, wherein the high-dielectric insulating film contains Hf or Zr.

20. The semiconductor device according to claim 1, wherein the high-dielectric insulating film contains HfSiON.

21. The semiconductor device according to claim 4, wherein the high-dielectric insulating film contains HfSiON.

22. A semiconductor device, comprising:

a support substrate;

an oxide film layer formed on the support substrate; and an nMOS transistor and a pMOS transistor formed on the oxide film layer, wherein the pMOS transistor comprising:

an n-type region formed on the oxide film layer;

a first gate insulating film formed on the n-type region, the first gate insulating film including a high-dielectric insulating film;

a first gate electrode formed on the first gate insulating film, the first gate electrode including silicide region (1) in contact with the first gate insulating film, the silicide region (1) comprising at least one type of crystalline phase selected from the group consisting of an NiSi crystalline phase and an NiSi$_2$ crystalline phase; and a source/drain region formed throughout on both portions in the n-type region sandwiching the first gate electrode in the direction of a normal to the surface where the n-type region is in contact with the first gate insulating film, the length of the n-type region in the direction of the normal to the surface where the n-type region is in contact with the first gate insulating film is one-fourth of a gate length of the pMOS transistor or smaller, and the nMOS transistor comprising:

a p-type region formed on the oxide film layer;

a second gate insulating film formed on the p-type region, the second gate insulating film including a high-dielectric insulating film;

a second gate electrode formed on the second gate insulating film, the second gate electrode including silicide region (2) in contact with the second gate insulating film, the silicide region (2) comprising at least one type of crystalline phase selected from the group consisting of an $Ni_2Si$ crystalline phase and an $Ni_2Si$ crystalline phase; and a source/drain region formed throughout on both portions in the p-type region sandwiching the second gate electrode in the direction of a normal to the surface where the p-type region is in contact with the second gate insulating film, the length of the p-type region in the direction of the normal to the surface where the p-type region is in contact with the second gate insulating film is one-fourth of a gate length of the nMOS transistor or smaller.

23. The semiconductor device according to claim 22, wherein the pMOS transistor and the nMOS transistor form a CMOS transistor.

24. The semiconductor device according to claim 22, further comprising an isolation region that isolates the n-type region from the p-type region, the n-type region, the p-type region, and the isolation region form a single plane on the oxide film layer, and the first and second gate electrodes are formed on the plane.

25. The semiconductor device according to claim 24, wherein at least one of the first and second gate electrodes includes a low-resistance layer as the top layer.

26. The semiconductor device according to claim 22, wherein the n-type region and the p-type region are a protruding n-type region and a protruding p-type region separately formed and protruding from the oxide film layer, the first gate electrode and the first gate insulating film are formed on both sides of the protruding n-type region, and the second gate electrode and the second gate insulating film are formed on both sides of the protruding p-type region.

27. The semiconductor device according to claim 22, wherein the entire first and second electrodes are comprised of silicide regions (1) and (2), respectively.

28. The semiconductor device according to claim 22, wherein the length of the n-type region in the direction of the normal to the surface where the n-type region is in contact with the first gate insulating film and the length of the p-type region in the direction of the normal to the surface where the p-type region is in contact with the second gate insulating film range from 5 to 20 nm.

29. The semiconductor device according to claim 22, wherein the high-dielectric insulating film is a film made of a metal oxide, a metal silicate, or a metal-oxide- or metal-silicate-based material to which nitrogen is introduced.

30. The semiconductor device according to claim 22, wherein the high-dielectric insulating film contains Hf or Zr.

31. The semiconductor device according to claim 22, wherein the high-dielectric insulating film contains HfSiON.

32. The semiconductor device according to claim 24, wherein the length of the n-type region in the direction of the normal to the surface where the n-type region is in contact with the first gate insulating film and the length of the p-type region in the direction of the normal to the surface where the p-type region is in contact with the second gate insulating film range from 5 to 20 nm.

33. The semiconductor device according to claim 25, wherein the length of the n-type region in the direction of the normal to the surface where the n-type region is in contact with the first gate insulating film and the length of the p-type region in the direction of the normal to the surface where the p-type region is in contact with the second gate insulating film range from 5 to 20 nm.

34. The semiconductor device according to claim 24, wherein the high-dielectric insulating film is a film made of a metal oxide, a metal silicate, or a metal-oxide- or metal-silicate-based material to which nitrogen is introduced.

35. The semiconductor device according to claim 25, wherein the high-dielectric insulating film is a film made of a metal oxide, a metal silicate, or a metal-oxide- or metal-silicate-based material to which nitrogen is introduced.

36. The semiconductor device according to claim 24, wherein the high-dielectric insulating film contains Hf or Zr.

37. The semiconductor device according to claim 25, wherein the high-dielectric insulating film contains Hf or Zr.

38. The semiconductor device according to claim 24, wherein the high-dielectric insulating film contains HfSiON.

39. The semiconductor device according to claim 25, wherein the high-dielectric insulating film contains HfSiON.

40. A semiconductor device, comprising:

a support substrate;

an oxide film layer formed on the support substrate; and a pMOS transistor formed on the oxide film layer, wherein the pMOS transistor is a fully depleted MOS transistor, the pMOS transistor comprising:

an n-type region formed on the oxide film layer;

a first gate insulating film formed on the n-type region, the first gate insulating film including a high-dielectric insulating film;

a first gate electrode formed on the first gate insulating film, the first gate electrode including silicide region (1) in contact with the first gate insulating film, the silicide region (1) comprising at least one type of crystalline phase selected from the group consisting of an NiSi crystalline phase and an $NiSi_2$ crystalline phase; and a source/drain region formed throughout on both portions in the n-type region sandwiching the first gate electrode in the direction of a normal to the surface where the n-type region is in contact with the first gate insulating film.

41. A method for manufacturing a semiconductor device according to claim 40 in which the first gate electrode includes the silicide region (1) comprising the NiSi or the $NiSi_2$ crystalline phase, the method comprising:

preparing a substrate in which the support substrate, the oxide film layer, and a semiconductor layer with the n-type region are sequentially stacked;

depositing a first gate insulating film material including the high-dielectric insulating film layer on the semiconductor layer;

depositing a polysilicon layer and a mask layer sequentially on the first gate insulating film material;

patterning the first gate insulating film material, the polysilicon layer, and the mask layer to form the first gate insulating film, a first gate electrode material, and mask (A) that protrude from the n-type region;

forming a gate sidewall on the sides of the first gate insulating film, the first gate electrode material, and the mask (A);

implanting a p-type impurity into the n-type region by using the gate sidewall and the mask (A) as a mask and carrying out heat treatment to form the source/drain region;

depositing an interlayer insulating film all over the semiconductor layer;

removing part of the interlayer insulating film and the mask (A) to expose the first gate electrode material;

depositing an Ni layer on the first gate electrode material;

converting the first gate electrode material into the first gate electrode including the silicide region (1) comprising the NiSi or the NiSi$_2$ crystalline phase by carrying out heat treatment to react the first gate electrode material with Ni; and removing the Ni layer not being reacted in converting the first gate electrode material into the first gate electrode.

42. The semiconductor device according to claim 40, wherein the high-dielectric insulating film is a film made of a metal oxide, a metal silicate, or a metal-oxide- or metal-silicate-based material to which nitrogen is introduced.

43. The semiconductor device according to claim 40, wherein the high-dielectric insulating film contains Hf or Zr.

44. The semiconductor device according to claim 40, wherein the high-dielectric insulating film contains HfSiON.

45. A semiconductor device comprising:
a support substrate;
an oxide film layer formed on the support substrate; and
an nMOS transistor formed on the oxide film layer,
wherein the nMOS transistor is a fully depleted MOS transistor,
the nMOS transistor comprising:
a p-type region formed on the oxide film layer;
a second gate insulating film formed on the p-type region, the second gate insulating film including a high-dielectric insulating film;
a second gate electrode formed on the second gate insulating film, the second gate electrode including silicide region (2) in contact with the second gate insulating film, the silicide region (2) comprising at least one type of crystalline phase selected from the group consisting of an Ni$_2$Si crystalline phase and an Ni$_2$Si crystalline phase; and a source/drain region formed throughout on both portions in the p-type region sandwiching the second gate electrode in the direction of a normal to the surface where the p-type region is in contact with the second gate insulating film.

46. A method for manufacturing a semiconductor device according to claim 45 in which the second gate electrode includes the silicide region (2) comprising the Ni$_2$Si crystalline phase or the Ni$_3$Si crystalline phase, the method comprising:
preparing a substrate in which the support substrate, the oxide film layer, and a semiconductor layer with the p-type region are sequentially stacked;

depositing a second gate insulating film material including the high-dielectric insulating film layer on the semiconductor layer;

depositing a polysilicon layer and a mask layer sequentially on the second gate insulating film material;

patterning the second gate insulating film material, the polysilicon layer, and the mask layer to form the second gate insulating film, a second gate electrode material, and mask (C) that protrud from the p-type region;

forming a gate sidewall on the sides of the second gate insulating film, the second gate electrode material, and the mask (C);

implanting an n-type impurity into the p-type region by using the gate sidewall and the mask (C) as a mask and carrying out heat treatment to form the source/drain region;

depositing an interlayer insulating film all over the semiconductor layer;

removing part of the interlayer insulating film and the mask (C) to expose the second gate electrode material;

depositing an Ni layer as a metal layer on the second gate electrode material;

converting the second gate electrode material into the second gate electrode including the silicide region (2) comprising the Ni$_2$Si crystalline phase or the Ni$_3$Si crystalline phase by carrying out heat treatment to react the second gate electrode material with Ni; and removing the metal layer being not reacted in in converting the second gate electrode material into the second gate electrode.

47. The semiconductor device according to claim 45, wherein the high-dielectric insulating film is a film made of a metal oxide, a metal silicate, or a metal-oxide- or metal-silicate-based material to which nitrogen is introduced.

48. The semiconductor device according to claim 45, wherein the high-dielectric insulating film contains Hf or Zr.

49. The semiconductor device according to claim 45, wherein the high-dielectric insulating film contains HfSiON.

* * * * *